US012566368B2

(12) United States Patent
Cao et al.

(10) Patent No.: US 12,566,368 B2
(45) Date of Patent: Mar. 3, 2026

(54) METHOD FOR DETERMINING A MASK PATTERN COMPRISING OPTICAL PROXIMITY CORRECTIONS USING A TRAINED MACHINE LEARNING MODEL

(71) Applicant: ASML NETHERLANDS B.V., Veldhoven (NL)

(72) Inventors: Yu Cao, Saratoga, CA (US); Jun Tao, Cupertino, CA (US); Quan Zhang, San Jose, CA (US); Yongsheng Shu, San Jose, CA (US); Wei-chun Fong, Sunnyvale, CA (US)

(73) Assignee: ASML NETHERLANDS, Veldhoven (NL)

( * ) Notice: Subject to any disclaimer, the term of this patent is extended or adjusted under 35 U.S.C. 154(b) by 579 days.

(21) Appl. No.: 17/796,751

(22) PCT Filed: Feb. 4, 2021

(86) PCT No.: PCT/EP2021/052724
§ 371 (c)(1),
(2) Date: Aug. 1, 2022

(87) PCT Pub. No.: WO2021/160522
PCT Pub. Date: Aug. 19, 2021

(65) Prior Publication Data
US 2023/0100578 A1        Mar. 30, 2023

Related U.S. Application Data

(60) Provisional application No. 62/975,267, filed on Feb. 12, 2020.

(51) Int. Cl.
*G03F 1/36* (2012.01)
*G03F 7/00* (2006.01)
(Continued)

(52) U.S. Cl.
CPC ............ *G03F 1/36* (2013.01); *G03F 7/70441* (2013.01); *G06F 30/27* (2020.01); *G06F 30/398* (2020.01)

(58) Field of Classification Search
None
See application file for complete search history.

(56) References Cited

U.S. PATENT DOCUMENTS 5,229,872 A     7/1993   Mumola
5,296,891 A     3/1994   Vogt et al.
(Continued)

FOREIGN PATENT DOCUMENTS

CN      109582995      4/2019
CN      110727171      1/2020
(Continued)

OTHER PUBLICATIONS

Office Action issued in corresponding Chinese Patent Application No. 202180014147, dated Dec. 30, 2024.
(Continued)

*Primary Examiner* — Leigh M Garbowski
(74) *Attorney, Agent, or Firm* — Pillsbury Winthrop Shaw Pittman LLP

(57) ABSTRACT
A method for determining a mask pattern and a method for training a machine learning model. The method for determining a mask pattern includes obtaining, via executing a model using a target pattern to be printed on a substrate as an input pattern, a post optical proximity correction (post-OPC) pattern; determining, based on the post-OPC pattern, a simulated pattern that will be printed on the substrate; and determining the mask pattern based on a difference between the simulated pattern and the target pattern. The determining of the mask pattern includes modifying, based on the difference, the input pattern inputted to the model such that the
(Continued)

difference is reduced; and executing, using the modified input pattern, the model to generate a modified post-OPC pattern from which the mask pattern can be derived.

20 Claims, 21 Drawing Sheets

(51) Int. Cl.
    G06F 30/27 (2020.01)
    G06F 30/398 (2020.01)

(56) References Cited

U.S. PATENT DOCUMENTS

| | | | |
|---|---|---|---|
| 5,523,193 A | 6/1996 | Nelson | |
| 5,969,441 A | 10/1999 | Loopstra et al. | |
| 6,046,792 A | 4/2000 | Van Der Werf et al. | |
| 7,587,704 B2 | 9/2009 | Ye et al. | |
| 7,617,477 B2 * | 11/2009 | Ye | G03F 1/84 |
| | | | 716/56 |
| 7,752,595 B2 * | 7/2010 | Maeda | G03F 1/36 |
| | | | 430/5 |
| 7,765,515 B2 * | 7/2010 | Ying | G03F 1/36 |
| | | | 716/52 |
| 7,882,480 B2 * | 2/2011 | Ye | G03F 1/36 |
| | | | 716/53 |
| 8,141,008 B2 * | 3/2012 | Zach | G03F 1/36 |
| | | | 716/54 |
| 8,200,468 B2 | 6/2012 | Ye et al. | |
| 8,296,688 B2 * | 10/2012 | Barnes | G03F 7/70641 |
| | | | 716/51 |
| 8,321,818 B2 * | 11/2012 | Agarwal | G03F 1/36 |
| | | | 716/54 |
| 8,423,924 B1 * | 4/2013 | Pierrat | G03F 1/68 |
| | | | 716/54 |
| 8,542,340 B2 * | 9/2013 | Ye | G03F 7/70666 |
| | | | 355/77 |
| 8,584,056 B2 | 11/2013 | Chen et al. | |
| 8,739,098 B1 * | 5/2014 | Clifford | G03F 1/72 |
| | | | 716/112 |
| 9,111,062 B2 | 8/2015 | Chen et al. | |
| 9,484,186 B2 * | 11/2016 | Song | H01J 37/3174 |
| 9,588,438 B2 | 3/2017 | Hsu et al. | |
| 10,866,505 B2 * | 12/2020 | Huang | G03F 1/70 |
| 11,061,318 B2 * | 7/2021 | Lo | G03F 1/70 |
| 11,379,970 B2 | 7/2022 | Koopman et al. | |
| 2005/0076322 A1 | 4/2005 | Ye et al. | |
| 2007/0031745 A1 | 2/2007 | Ye et al. | |
| 2007/0050749 A1 | 3/2007 | Ye et al. | |
| 2008/0189673 A1 * | 8/2008 | Ying | G03F 1/36 |
| | | | 716/52 |
| 2008/0301620 A1 | 12/2008 | Ye et al. | |
| 2008/0309897 A1 | 12/2008 | Wong et al. | |
| 2010/0162197 A1 | 6/2010 | Ye et al. | |
| 2010/0180251 A1 | 7/2010 | Ye et al. | |
| 2010/0315614 A1 | 12/2010 | Hansen | |
| 2011/0099526 A1 | 4/2011 | Li | |
| 2016/0335384 A1 * | 11/2016 | Song | G03F 1/80 |
| 2017/0357911 A1 | 12/2017 | Liu et al. | |
| 2019/0147134 A1 * | 5/2019 | Wang | G06F 30/20 |
| | | | 716/52 |
| 2020/0380362 A1 | 12/2020 | Cao et al. | |
| 2024/0126183 A1 * | 4/2024 | Hamouda | G03F 7/70441 |

FOREIGN PATENT DOCUMENTS

| | | |
|---|---|---|
| EP | 3441819 | 2/2019 |
| TW | 201915598 | 4/2019 |
| TW | 201939365 | 10/2019 |
| TW | 201942769 | 11/2019 |
| WO | 2010059954 | 5/2010 |
| WO | 2016/061218 | 4/2016 |
| WO | 2019048506 | 3/2019 |
| WO | 2019162346 | 8/2019 |

OTHER PUBLICATIONS

International Search Report and Written Opinion issued in corresponding PCT Patent Application No. PCT/EP2021/052724, dated Apr. 4, 2021.

Taiwanese Office Action issued in corresponding Taiwanese Patent Application No. 110104636, dated Feb. 10, 2022.

Spence, C. et al.: "Manufacturing Challenges for Curvilinear Masks", Proc. of SPIE, vol. 10451 (Oct. 16, 2017).

Spence, C.: "Full-Chip Lithography Simulation and Design Analysis—How OPC Is Changing IC Design", Proc. of SPIE, vol. 5751, pp. 1-14 (2005).

Cao, Y. et al.: "Optimized Hardware and Software For Fast, Full Chip Simulation", Proc. of SPIE, vol. 5754 (2005).

Rosenbluth, A.E. et al.: "Optimum Mask and Source Patterns to Print A Given Shape", Journal of Microlithography, Microfabrication, Microsystems, Proc. of SPIE, 1(1), pp. 13-20 (2002).

Granik, Y.: "Source Optimization for Image Fidelity and Throughput", Journal of Microlithography, Microfabrication, Microsystems 3(4), pp. 509-522 (Oct. 2004).

Socha, R. et al.: "Simultaneous Source Mask Optimization (SMO)", Proc. of SPIE, vol. 5853, (2005).

Shen, Y. et al.: "Level-set-based inverse lithography for photomask synthesis", Optics Express, vol. 17, No. 26 (Dec. 21, 2009).

Wang, S. et al.: "Machine learning assisted SRAF Placement for full chip", Proc of SPIE, vol. 10451 (Oct. 16, 2017).

Office Action issued in corresponding Chinese Patent Application No. 202180014147.4, dated Jul. 16, 2025.

* cited by examiner

700

1

METHOD FOR DETERMINING A MASK PATTERN COMPRISING OPTICAL PROXIMITY CORRECTIONS USING A TRAINED MACHINE LEARNING MODEL

CROSS-REFERENCE TO RELATED APPLICATIONS

This application is the U.S. national phase entry of PCT Patent Application No. PCT/EP2021/052724 which was filed on Feb. 4, 2021, which claims the benefit of priority of U.S. Provisional Application No. 62/975,267 which was filed on Feb. 12, 2020 and which is incorporated herein in its entirety by reference.

TECHNICAL FIELD

The description herein relates to lithographic apparatuses and processes, and more particularly method for generating a mask pattern and method for training a machine learning model configured to generate an optical proximity correction pattern.

BACKGROUND

A lithographic projection apparatus can be used, for example, in the manufacture of integrated circuits (ICs). In such a case, a patterning device (e.g., a mask) may contain or provide a circuit pattern corresponding to an individual layer of the IC ("design layout"), and this circuit pattern can be transferred onto a target portion (e.g. comprising one or more dies) on a substrate (e.g., silicon wafer) that has been coated with a layer of radiation-sensitive material ("resist"), by methods such as irradiating the target portion through the circuit pattern on the patterning device. In general, a single substrate contains a plurality of adjacent target portions to which the circuit pattern is transferred successively by the lithographic projection apparatus, one target portion at a time. In one type of lithographic projection apparatuses, the circuit pattern on the entire patterning device is transferred onto one target portion in one go; such an apparatus is commonly referred to as a wafer stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the circuit pattern on the patterning device are transferred to one target portion progressively. Since, in general, the lithographic projection apparatus will have a magnification factor M (generally <1), the speed F at which the substrate is moved will be a factor M times that at which the projection beam scans the patterning device. More information with regard to lithographic devices as described herein can be gleaned, for example, from U.S. Pat. No. 6,046,792, incorporated herein by reference.

Prior to transferring the circuit pattern from the patterning device to the substrate, the substrate may undergo various procedures, such as priming, resist coating and a soft bake. After exposure, the substrate may be subjected to other procedures, such as a post-exposure bake (PEB), development, a hard bake and measurement/inspection of the transferred circuit pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

As noted, microlithography is a central step in the manufacturing of ICs, where patterns formed on substrates define functional elements of the ICs, such as microprocessors, memory chips etc. Similar lithographic techniques are also used in the formation of flat panel displays, micro-electro mechanical systems (MEMS) and other devices.

As semiconductor manufacturing processes continue to advance, the dimensions of functional elements have continually been reduced while the amount of functional elements, such as transistors, per device has been steadily increasing over decades, following a trend commonly referred to as "Moore's law". At the current state of technology, layers of devices are manufactured using lithographic projection apparatuses that project a design layout onto a substrate using illumination from a deep-ultraviolet illumination source, creating individual functional elements having dimensions well below 100 nm, i.e. less than half the wavelength of the radiation from the illumination source (e.g., a 193 nm illumination source).

This process in which features with dimensions smaller than the classical resolution limit of a lithographic projection apparatus are printed, is commonly known as low-$k_1$ lithography, according to the resolution formula $CD=k_1 \times \lambda/NA$, where $\lambda$ is the wavelength of radiation employed (currently in most cases 248 nm or 193 nm), NA is the numerical aperture of projection optics in the lithographic projection apparatus, CD is the "critical dimension"—generally the smallest feature size printed—and $k_1$ is an empirical resolution factor. In general, the smaller $k_1$ the more difficult it becomes to reproduce a pattern on the substrate that resembles the shape and dimensions planned by a circuit designer in order to achieve particular electrical functionality and performance. To overcome these difficulties, sophisticated fine-tuning steps are applied to the lithographic projection apparatus and/or design layout. These include, for example, but not limited to, optimization of NA and optical coherence settings, customized illumination schemes, use of phase shifting patterning devices, optical proximity correction (OPC, sometimes also referred to as "optical and process correction") in the design layout, or other methods generally defined as "resolution enhancement techniques" (RET). The term "projection optics" as used herein should be broadly interpreted as encompassing various types of optical systems, including refractive optics, reflective optics, apertures and catadioptric optics, for example. The term "projection optics" may also include components operating according to any of these design types for directing, shaping or controlling the projection beam of radiation, collectively or singularly. The term "projection optics" may include any optical component in the lithographic projection apparatus, no matter where the optical component is located on an optical path of the lithographic projection apparatus. Projection optics may include optical components for shaping, adjusting and/or projecting radiation from the source before the radiation passes the patterning device, and/or optical components for shaping, adjusting and/or projecting the radiation after the radiation passes the patterning device. The projection optics generally exclude the source and the patterning device.

BRIEF SUMMARY

In an embodiment, there is provided a method for determining a mask pattern to be employed in a patterning process. The method includes obtaining, via executing a model using a target pattern to be printed on a substrate as an input pattern, a post optical proximity correction (post-OPC) pattern; determining, based on the post-OPC pattern, a simulated pattern that will be printed on the substrate; and determining the mask pattern based on a difference between the simulated pattern and the target pattern. The determining of the mask pattern includes modifying, based on the difference, the input pattern inputted to the model such that the difference is reduced; and executing, using the modified input pattern, the model to generate a modified post-OPC pattern from which the mask pattern can be derived.

Furthermore, there is provided a method of training a machine learning model associated with a patterning process. The method includes obtaining a training data set comprising: (i) a set of perturbed target patterns associated with a target pattern to be printed on a substrate, and (ii) a set of reference patterns, each reference pattern being associated with a particular perturbed target pattern of the set of perturbed target pattern; and training, using the training data set, the machine learning model to generate a post-OPC pattern such that the model-generated post-OPC pattern tailored to match a particular reference pattern of the set of reference patterns.

Furthermore, there is provided a non-transitory computer-readable medium comprising instructions that, when executed by one or more processors, cause operations including obtaining, via executing a model using a target pattern to be printed on a substrate as an input pattern, a post optical proximity correction (post-OPC) pattern; determining, based on the post-OPC pattern, a simulated pattern that will be printed on the substrate; and determining a mask pattern based on a difference between the simulated pattern and the target pattern by: modifying, based on the difference, the input pattern inputted to the model such that the difference is reduced; and executing, using the modified input pattern, the model to generate a modified post-OPC pattern from which the mask pattern can be derived.

Furthermore, there is provided a non-transitory computer-readable medium comprising instructions that, when executed by one or more processors, cause operations including obtaining a training data set comprising: (i) a set of perturbed target patterns associated with a target pattern to be printed on a substrate, and (ii) a set of reference patterns, each reference pattern being associated with a particular perturbed target pattern of the set of perturbed target pattern; and training, using the training data set, the machine learning model to generate a post-OPC pattern such that the model-generated post-OPC pattern tailored to match a particular reference pattern of the set of reference patterns.

BRIEF DESCRIPTION OF THE DRAWINGS

Embodiments will now be described, by way of example only, with reference to the accompanying drawings in which.

Figure 1:
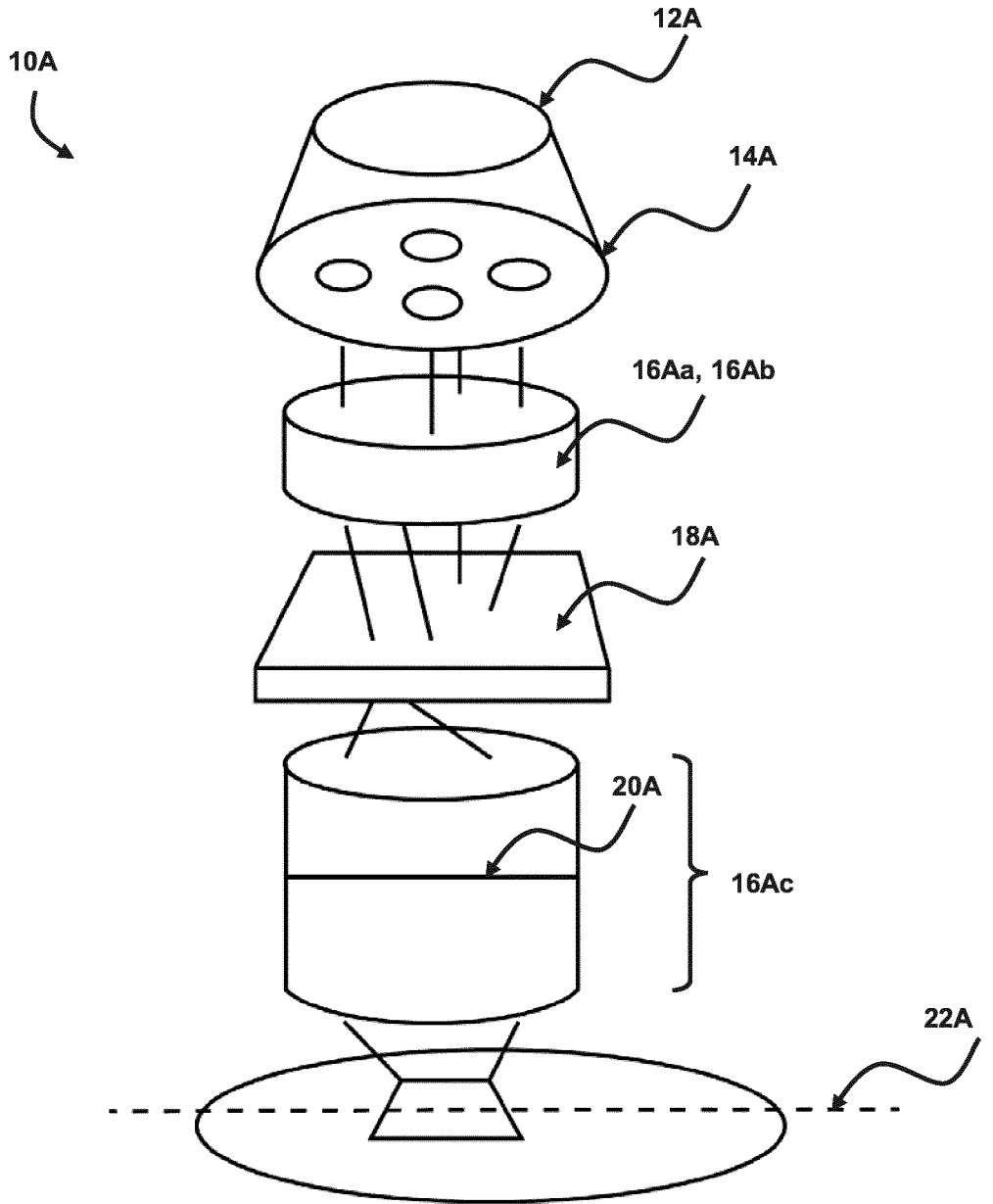
FIG. 1 is a block diagram of various subsystems of a lithography system, according to an embodiment.

Embodiments will now be described in detail with reference to the drawings, which are provided as illustrative examples so as to enable those skilled in the art to practice the embodiments. Notably, the figures and examples below are not meant to limit the scope to a single embodiment, but other embodiments are possible by way of interchange of some or all of the described or illustrated elements. Wherever convenient, the same reference numbers will be used throughout the drawings to refer to same or like parts. Where certain elements of these embodiments can be partially or fully implemented using known components, only those portions of such known components that are necessary for an understanding of the embodiments will be described, and detailed descriptions of other portions of such known components will be omitted so as not to obscure the description of the embodiments. In the present specification, an embodiment showing a singular component should not be considered limiting; rather, the scope is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the scope encompasses present and future known equivalents to the components referred to herein by way of illustration.

DETAILED DESCRIPTION

Although specific reference may be made in this text to the manufacture of ICs, it should be explicitly understood that the description herein has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as interchangeable with the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm).

The term "optimizing" and "optimization" as used herein mean adjusting a lithographic projection apparatus such that results and/or processes of lithography have more desirable characteristics, such as higher accuracy of projection of design layouts on a substrate, larger process windows, etc.

Further, the lithographic projection apparatus may be of a type having two or more substrate tables (and/or two or more patterning device tables). In such "multiple stage" devices the additional tables may be used in parallel, or preparatory steps may be carried out on one or more tables while one or more other tables are being used for exposures. Twin stage lithographic projection apparatuses are described, for example, in U.S. Pat. No. 5,969,441, incorporated herein by reference.

The patterning device referred to above comprises or can form design layouts. The design layouts can be generated utilizing CAD (computer-aided design) programs, this process often being referred to as EDA (electronic design automation). Most CAD programs follow a set of predetermined design rules in order to create functional design layouts/patterning devices. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or hole or the smallest space between two lines or two holes. Thus, the CD determines the overall size and density of the designed circuit. Of course, one of the goals in integrated circuit fabrication is to faithfully reproduce the original circuit design on the substrate (via the patterning device).

The term "mask" or "patterning device" as employed in this text may be broadly interpreted as referring to a generic patterning device that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning devices include:

a programmable mirror array. An example of such a device is a matrix-addressable surface having a viscoelastic control layer and a reflective surface. The basic principle behind such an apparatus is that (for example) addressed areas of the reflective surface reflect incident radiation as diffracted radiation, whereas unaddressed areas reflect incident radiation as undiffracted radiation. Using an appropriate filter, the said undiffracted radiation can be filtered out of the reflected beam, leaving only the diffracted radiation behind; in this manner, the beam becomes patterned according to the addressing pattern of the matrix-addressable surface. The required matrix addressing can be performed using suitable electronic means. More information on such mirror arrays can be gleaned, for example, from U.S. Pat. Nos. 5,296,891 and 5,523,193, which are incorporated herein by reference.

a programmable LCD array. An example of such a construction is given in U.S. Pat. No. 5,229,872, which is incorporated herein by reference.

As a brief introduction, FIG. 1 illustrates an exemplary lithographic projection apparatus 10A. Major components are a radiation source 12A, which may be a deep-ultraviolet excimer laser source or other type of source including an extreme ultra violet (EUV) source (as discussed above, the lithographic projection apparatus itself need not have the radiation source), illumination optics which define the partial coherence (denoted as sigma) and which may include optics 14A, 16Aa and 16Ab that shape radiation from the source 12A; a patterning device 14A; and transmission optics 16Ac that project an image of the patterning device pattern onto a substrate plane 22A. An adjustable filter or aperture 20A at the pupil plane of the projection optics may restrict the range of beam angles that impinge on the substrate plane 22A, where the largest possible angle defines the numerical aperture of the projection optics $NA=\sin(\Theta_{max})$.

In an optimization process of a system, a figure of merit of the system can be represented as a cost function. The optimization process boils down to a process of finding a set of parameters (design variables) of the system that minimizes the cost function. The cost function can have any suitable form depending on the goal of the optimization. For example, the cost function can be weighted root mean square (RMS) of deviations of certain characteristics (evaluation points) of the system with respect to the intended values (e.g., ideal values) of these characteristics; the cost function can also be the maximum of these deviations (i.e., worst deviation). The term "evaluation points" herein should be interpreted broadly to include any characteristics of the system. The design variables of the system can be confined to finite ranges and/or be interdependent due to practicalities of implementations of the system. In case of a lithographic projection apparatus, the constraints are often associated with physical properties and characteristics of the hardware such as tunable ranges, and/or patterning device manufacturability design rules, and the evaluation points can include physical points on a resist image on a substrate, as well as non-physical characteristics such as dose and focus.

In a lithographic projection apparatus, a source provides illumination (i.e. light); projection optics direct and shapes the illumination via a patterning device and onto a substrate. The term "projection optics" is broadly defined here to include any optical component that may alter the wavefront of the radiation beam. For example, projection optics may include at least some of the components 14A, 16Aa, 16Ab and 16Ac. An aerial image (AI) is the radiation intensity distribution at substrate level. A resist layer on the substrate is exposed and the aerial image is transferred to the resist layer as a latent "resist image" (RI) therein. The resist image (RI) can be defined as a spatial distribution of solubility of the resist in the resist layer. A resist model can be used to calculate the resist image from the aerial image, an example of which can be found in commonly assigned U.S. patent application Ser. No. 12/315,849, disclosure of which is hereby incorporated by reference in its entirety. The resist model is related only to properties of the resist layer (e.g., effects of chemical processes which occur during exposure, PEB and development). Optical properties of the lithographic projection apparatus (e.g., properties of the source, the patterning device and the projection optics) dictate the aerial image. Since the patterning device used in the lithographic projection apparatus can be changed, it is desirable to separate the optical properties of the patterning device from the optical properties of the rest of the lithographic projection apparatus including at least the source and the projection optics.

Figure 2:
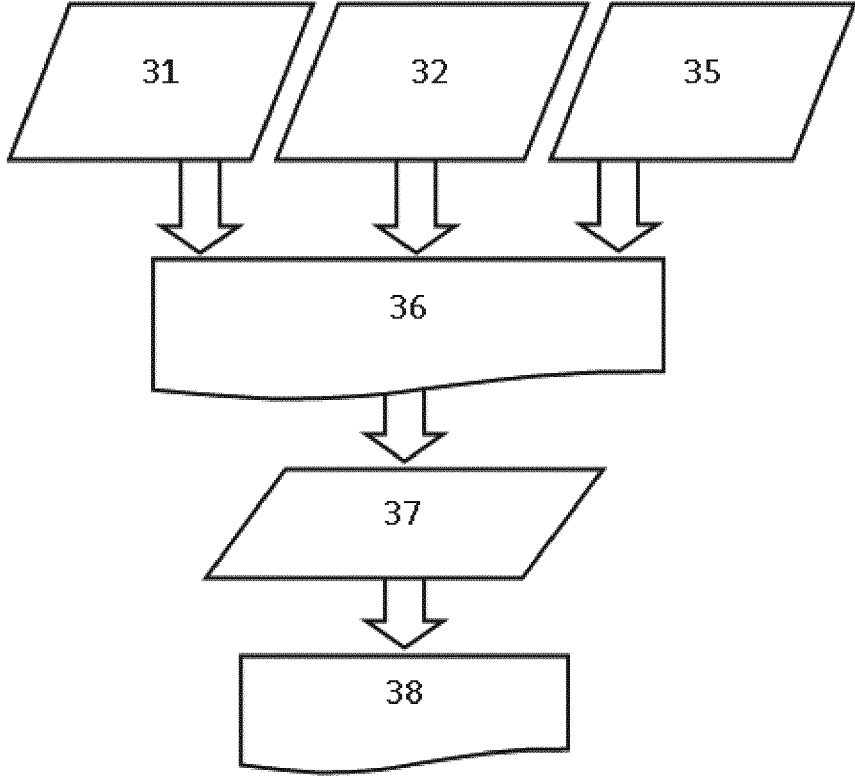
FIG. 2 is a block diagram of simulation models corresponding to the subsystems in FIG. 1, according to an embodiment.

An exemplary flow chart for simulating lithography in a lithographic projection apparatus is illustrated in FIG. 2. A source model 31 represents optical characteristics (including radiation intensity distribution and/or phase distribution) of the source. A projection optics model 32 represents optical characteristics (including changes to the radiation intensity distribution and/or the phase distribution caused by the projection optics) of the projection optics. A design layout model 35 represents optical characteristics (including changes to the radiation intensity distribution and/or the phase distribution caused by a given design layout 33) of a design layout, which is the representation of an arrangement of features on or formed by a patterning device. An aerial image 36 can be simulated from the design layout model 35, the projection optics model 32 and the design layout model 35. A resist image 38 can be simulated from the aerial image 36 using a resist model 37. Simulation of lithography can, for example, predict contours and CDs in the resist image.

More specifically, it is noted that the source model 31 can represent the optical characteristics of the source that include, but not limited to, NA-sigma (σ) settings as well as any particular illumination source shape (e.g. off-axis radiation sources such as annular, quadrupole, and dipole, etc.). The projection optics model 32 can represent the optical characteristics of the of the projection optics that include aberration, distortion, refractive indexes, physical sizes, physical dimensions, etc. The design layout model 35 can also represent physical properties of a physical patterning device, as described, for example, in U.S. Pat. No. 7,587, 704, which is incorporated by reference in its entirety. The objective of the simulation is to accurately predict, for example, edge placements, aerial image intensity slopes and CDs, which can then be compared against an intended design. The intended design is generally defined as a pre-OPC design layout which can be provided in a standardized digital file format such as GDSII or OASIS or other file format.

From this design layout, one or more portions may be identified, which are referred to as "clips". In an embodiment, a set of clips is extracted, which represents the complicated patterns in the design layout (typically about 50 to 1000 clips, although any number of clips may be used). As will be appreciated by those skilled in the art, these patterns or clips represent small portions (i.e. circuits, cells or patterns) of the design and especially the clips represent small portions for which particular attention and/or verification is needed. In other words, clips may be the portions of the design layout or may be similar or have a similar behavior of portions of the design layout where critical features are identified either by experience (including clips provided by a customer), by trial and error, or by running a full-chip simulation. Clips usually contain one or more test patterns or gauge patterns.

An initial larger set of clips may be provided a priori by a customer based on known critical feature areas in a design layout which require particular image optimization. Alternatively, in another embodiment, the initial larger set of clips may be extracted from the entire design layout by using some kind of automated (such as, machine vision) or manual algorithm that identifies the critical feature areas.

Simulation of the patterning process can, for example, predict contours, CDs, edge placement (e.g., edge placement error), pattern shift, etc. in the aerial, resist and/or etch image. That is, the aerial image 34, the resist image 36 or the etch image 40 may be used to determine a characteristic (e.g., the existence, location, type, shape, etc. of) of a pattern. Thus, the objective of the simulation is to accurately predict, for example, edge placement, and/or contours, and/or pattern shift, and/or aerial image intensity slope, and/or CD, etc. of the printed pattern. These values can be compared against an intended design to, e.g., correct the patterning process, identify where a defect is predicted to occur, etc. The intended design is generally defined as a pre-OPC design layout which can be provided in a standardized digital file format such as GDSII or OASIS or other file format.

Details of techniques and models used to transform a patterning device pattern into various lithographic images (e.g., an aerial image, a resist image, etc.), apply OPC using those techniques and models and evaluate performance (e.g., in terms of process window) are described in U.S. Patent Application Publication Nos. US 2008-0301620, 2007-0050749, 2007-0031745, 2008-0309897, 2010-0162197, 2010-0180251 and 2011-0099526, the disclosure of each which is hereby incorporated by reference in its entirety.

As lithography nodes keep shrinking, more and more complicated patterning device pattern (interchangeably referred as a mask for better readability) are required (e.g., curvilinear masks). The present method may be used in key layers with DUV scanners, EUV scanners, and/or other scanners. The method according to the present disclosure may be included in different aspect of the mask optimization process including source mask optimization (SMO), mask optimization, and/or OPC. For example, a source mask optimization process is described in U.S. Pat. No. 9,588,438 titled "Optimization Flows of Source, Mask and Projection Optics", which is hereby incorporated in its entirety by reference.

In an embodiment, a patterning device pattern is a curvilinear mask including curvilinear SRAFs having polygonal shapes, as opposed to that in Manhattan patterns having rectangular or staircase like shapes. A curvilinear mask may produce more accurate patterns on a substrate compared to a Manhattan pattern. However, the geometry of curvilinear SRAFs, their locations with respect to the target patterns, or other related parameters may create manufacturing restrictions, since such curvilinear shapes may not be feasible to manufacture. Hence, such restrictions may be considered by a designer during the mask design process. A detailed discussion on the limitation and challenges in manufacturing a curvilinear mask is provided in "Manufacturing Challenges for Curvilinear Masks" by Spence, et al., Proceeding of SPIE Volume 10451, Photomask Technology, 1045104 (16 Oct. 2017); doi: 10.1117/12.2280470, which is incorporated herein by reference in its entirety.

Optical Proximity Correction (OPC) is a photolithography enhancement technique commonly used to compensate for image errors due to diffraction and process effects. Existing model-based OPC usually consists of several steps, including: (i) derive wafer target pattern including rule retargeting, (ii) place sub-resolution assist features (SRAFs), and (iii) perform iterative corrections including model simulation (e.g., by calculating intensity map on a wafer). The most time consuming parts of the model simulation are model-based SRAF generation and cleanup based on mask rule check (MRC), and simulation of mask diffraction, optical imaging, and resist development.

One of the challenges in OPC simulation are runtime and accuracy. Usually, the more accurate the result is, the slower the OPC flow is. To get better process window, more model simulation under different conditions (nominal condition, defocus condition, off-dose condition) are needed in each OPC iteration. Also, the more patterning process related models are included, the more iterations are needed to make the OPC result converge to the target pattern. Because of the large amount of data that needs to be processed (billions of transistors on a chip), the runtime requirement imposes severe constraints on the complexity of the OPC related algorithm. In addition, the accuracy requirements become tighter as the shrink of integrated circuits continues. As such, new algorithms and techniques are needed to address these challenges. For example, a different solution is needed, for example, for polygon-based OPC. The present disclosure provides, for example, methods for determining post-OPC layouts. The methods provide high accuracy while maintaining high speed plus the simplicity of the post-OPC layout.

In an embodiment, the curvilinear mask pattern may be obtained from a continuous transmission mask (CTM+) process (an extension of CTM process) that employs a level-set method to generate curvilinear shapes of the initial mask pattern. An example of CTM process is discussed in U.S. Pat. No. 8,584,056, mentioned earlier. In an embodiment, the CTM+ process involves steps for determining, one or more characteristics of assist features of an initial mask pattern (or a mask pattern in general) using any suitable method, based on a portion of assist features or one or more characteristics thereof. For example, the one or more characteristics of assist features may be determined using a method described in U.S. Pat. No. 9,111,062, or described Y. Shen, et al., Level-Set-Based Inverse Lithography For Photomask Synthesis, Optics Express, Vol. 17, pp. 23690-23701 (2009), the disclosures of which are hereby incorporated by reference in their entirety. For example, the one or more characteristics may include one or more geometrical characteristics (e.g., absolute location, relative location, or shape) of the assist features, one or more statistical characteristics of the assist features, or parameterization of the assist features. Examples of a statistical characteristic of the assist features may include an average or variance of a geometric dimension of the assist features.

Conventional OPC performs iterative corrections on mask polygons using a multi-variable solver or single-variable solver, by propagating the difference between simulated wafer contour and desired target contour back to a mask plane. In order to achieve a good process window, lithography simulations for multiple process window conditions (e.g., dose-focus variations) is applied to determine the mask pattern. This process takes several iterations to converge to a final mask pattern.

On the other hand, an inverse OPC typically uses a gradient-based solver. The inverse OPC process employs a cost function that is minimized. The cost function comprises edge placement errors under different process conditions.

The inverse OPC process takes even more iterations to be converge than conventional OPC. The inverse OPC process the design layout in patches, and for each patch a curvilinear polygon shapes may be generated. It is challenging to merge the curvilinear shapes across patch boundaries, where each patch is processed separately with an iterative algorithm to merge the curvilinear mask shapes to generate a final mask pattern.

Deep learning based approaches may be developed to train machine learning models to speed up either conventional or inverse OPC. Typically a deep learning model (e.g., a Deep Convolutional Neural Network (DCNN)) is trained to convert a target pattern to a mask pattern. Training samples generated by a baseline OPC algorithm may be used for the training purposes. This deep learning model may not be perfect, but can provide a good approximation of a final mask pattern. The deep learning models require only a few iterations (i.e., significantly less than the conventional OPC or inverse OPC algorithm), thereby substantially speeding up the mask pattern generation process. However, additionally, a lithography simulation is used with multiple process window conditions, especially in final several iterations. A multi-variable solver of the lithography simulation is also time consuming, so it may still take significant computing time to achieve the final converged result i.e., a final mask pattern.

In the present disclosure, there is provides a method for generating a mask pattern. The new mask generation flow herein has a potential to further speed up the inverse OPC. It modifies an input pattern (e.g., a pattern having Manhattan polygons corresponding to a design layout), similar to the retargeting often used in OPC. For example, one approach for rule-based retargeting of the pre-OPC layout includes selective biases and pattern shifts. This approach may improve the full process window performance for certain critical features, while still calculating OPC corrections only at nominal process condition, by selectively changing the target edge placements that the OPC software uses as the desired final result. In the present disclosure, the flow converts the modified input pattern (e.g., retargeted pre-OPC layout) back to the mask plane using a pre-trained model. The modifications on the input pattern are intended to compensate for the imperfection of the inverse model, causing a faster convergence between the simulated wafer contour and the target contour. The method describes herein can potentially improve the runtime and resolve the boundary merge issues in inverse OPC without sacrificing the process window.

Figure 3A:
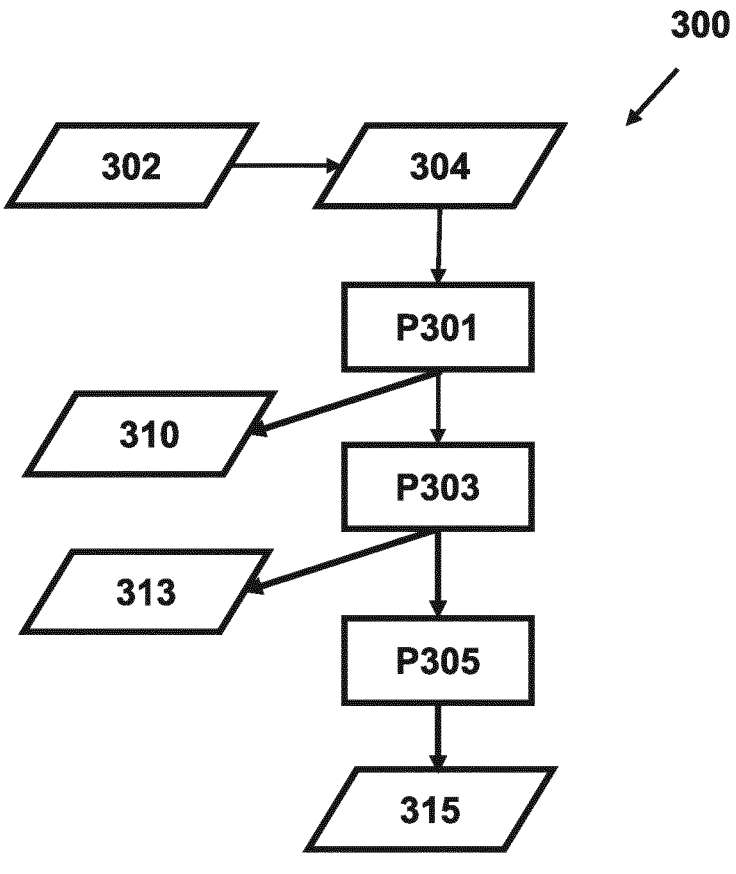
FIGS. 3A and 3B illustrate a flow chart of a method for determining a mask pattern to be employed in a patterning process, according to an embodiment.

FIG. 3A is a flow chart of a method 300 for determining a mask pattern to be employed in a patterning process. In an embodiment, the mask pattern can be broadly referred as a patterning device pattern. In an embodiment, the method 300 includes procedures as discussed below.

Procedure P301 includes obtaining, via executing a model 304 using a target pattern 302 to be printed on a substrate as an input pattern, a post optical proximity correction (post-OPC) pattern 310. In an embodiment, the model 304 is a trained machine learning model 304 configured to generate a post-OPC pattern 310 for an input pattern (e.g., 302). In an embodiment, the trained machine learning model is trained using, for example, a method 700 of FIG. 7A, discussed herein.

In an embodiment, the input pattern can be data represented as an image (e.g., a pixelated image) or image data (e.g. pixel location and intensity) associated with the target pattern 302 of a design layout or a biased design layout.

In an embodiment, the post-OPC pattern 310 can be data represented as an image (e.g., a pixelated image) or image data (e.g. pixel location and intensity). In an embodiment, the post-OPC pattern 310 includes pattern data e.g., a main feature data and (optionally) assist feature data. A main feature refers to a feature, corresponding to a target feature of the design layout, within a post-OPC pattern. In an embodiment, the main feature data and assist feature data can be separate. In an embodiment, the main feature data and the assist feature data can be represented as two different images or in combined form e.g., as a single image. In an embodiment, the model 304 is a convolutional neural network (CNN).

In an embodiment, the obtaining of the post-OPC pattern 310 involves obtaining data related to geometric shapes (e.g., polygon shapes such as square, rectangle, or circular shapes, etc.) of main features corresponding to target features of the design layout. Similarly, but optionally, geometric shapes of assist features can also be obtained. For example, image processing of the post-OPC image 310 can be performed for extracting the geometric shapes of the design layout, or a post-OPC image.

In an embodiment, a rasterization operation can be performed on the geometric shapes data to generate an image representation. For example, the rasterization operation converts the geometric shapes (e.g. in vector graphics format) to a pixelated image. In an embodiment, the rasterization may further involve applying a low-pass filter to clearly identify feature shapes and reduce noise.

Procedure P303 includes determining, based on the post-OPC pattern 310, a simulated pattern 313 that will be printed on the substrate. In an embodiment, the simulated pattern 313 can be represented as an image or image data. In an embodiment, the simulated pattern 313 is determined by executing a process model of the patterning process using the post-OPC pattern 310 or a modified post-OPC pattern (e.g., 323 in FIG. 3B) to generate a simulated pattern 313. In an embodiment, the process model may be a model of a lithography related process, for example, an after development process model. In an embodiment, the simulated pattern 313 can be an after development image. For example, the process model is a resist model and the simulated pattern 313 is a resist pattern. Additional simulation models, and resulting simulated outputs (e.g., resist pattern) are discussed with respect to FIG. 2.

In an embodiment, the simulated pattern 313 also includes information related to geometric shapes of a pattern that may be printed on a substrate. Such geometric shape information can be extracted by image processing employing as an edge detection algorithm.

The present disclosure is not limited to a particular process model. It can be understood that one or more combination of process models (e.g., resist model, etch model, discussed in FIG. 2) can be used to generate a simulated pattern. Accordingly, the method 300 can be modified to include one or more after development models and simulated patterns generated therefrom.

Procedure P305 includes determining the mask pattern 315 based on a difference between the simulated pattern 313 and the target pattern 302. In an embodiment, the determining of the mask pattern 315 includes modifying, based on the difference, the input pattern (e.g., 302 in a first iteration or 311 in a subsequent iteration) inputted to the model 304 such that the difference is reduced. Using the modified input pattern (e.g., 321), the model 304 can be executed to generate a modified post-OPC pattern (e.g., 323 in FIG. 3B) from which the mask pattern 315 can be derived. For example, geometric shapes of main features and (optionally) assist features may be extracted, e.g., via image processing, as discussed herein.

Figure 3B:
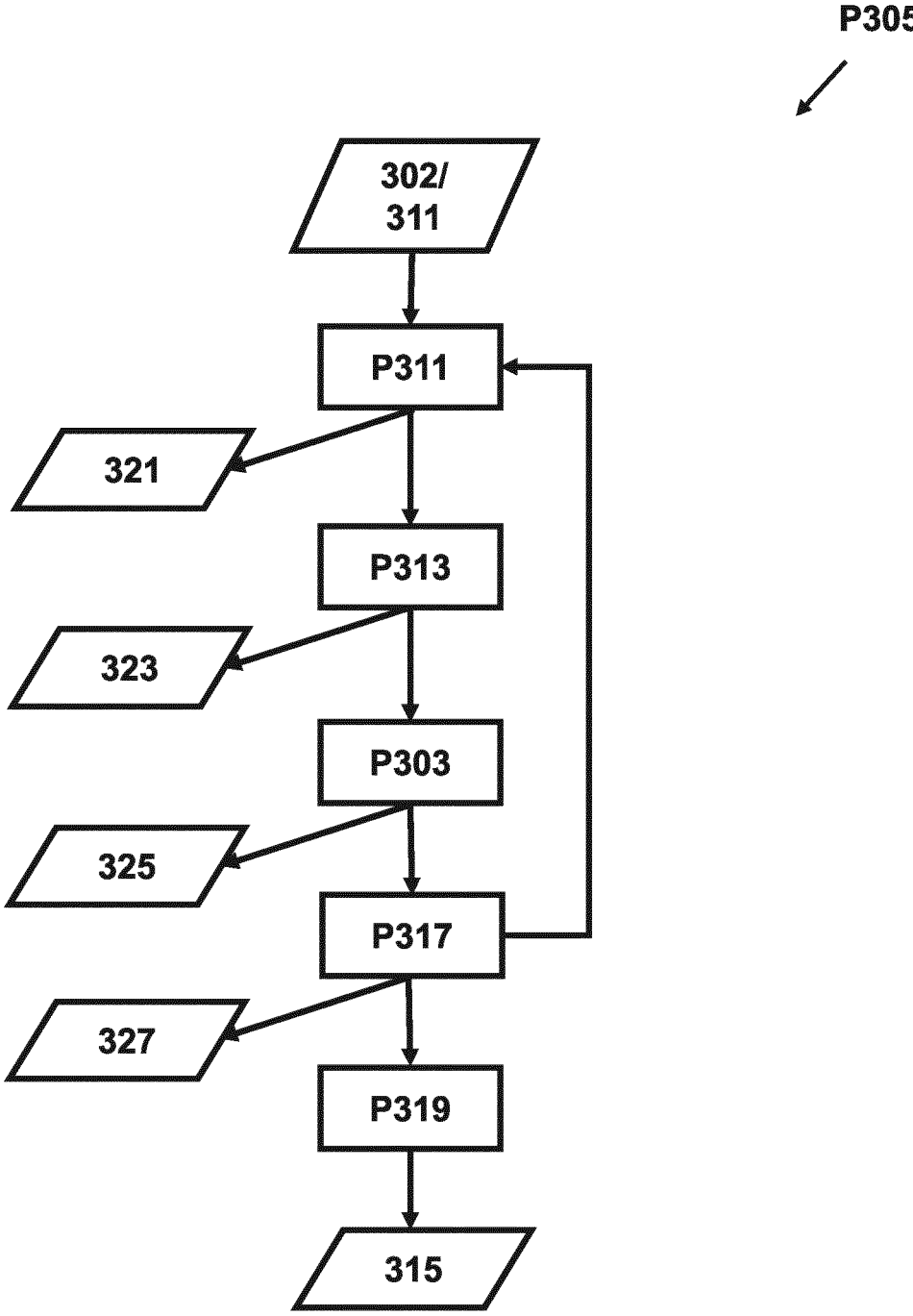

An example implementation of the procedure P305 for determining of the mask pattern 315 is explained in detail with respect to FIG. 3B. In an embodiment, the determining of the mask pattern 315 is an iterative process, each iteration comprising procedures P311, P313, P303, P317, and P319. In an embodiment, a predetermined number of iterations may be performed. In an embodiment, the iterations stop after a difference between a simulated pattern (e.g., 313 or 323) and the target pattern 302 is minimized.

Procedure P311 includes modifying at least a portion of the input pattern 311 using a gradient of the difference 327 between the simulated pattern 313 and the target pattern 302. The modifying of the input pattern 311 reduces (or in one embodiment, minimizes) the difference between the target pattern 302 and the simulated pattern 313. The gradient of the difference 327 is indicative of how the target pattern 302 be modified to reduce or minimize the difference 327.

In an embodiment, the at least a portion of the input pattern 311 comprises a contour (also referred as geometric shape) corresponding to a target feature within the target pattern 302. In an embodiment, the procedure P311 of modifying the input pattern 311 includes modifying, based on the gradient of the difference 327, the contour of the input pattern 311 to reduce the difference 327 between the target contour and the simulated contour, the gradient being indicative of how the contour of the input pattern 311 be modified to reduce or minimize the difference 327.

In an embodiment, the procedure P311 of modifying the input pattern 311 includes assigning control points on the target contour, and adjusting, based on the gradient of the difference 327, a position of one or more control point within the input pattern 311 causing the difference 327 to be reduced or minimized. In an embodiment, the gradient is a differential of the difference 327 with respect to the control points. The gradient indicates a change in the difference 327 due to a change in a position of a control point.

Procedure P313 includes executing, using the modified input pattern 321, the trained machine learning model 304 to generate the modified post-OPC pattern 323. Procedure P303 includes determining the simulated pattern 325 using the modified post-OPC pattern 323 as an input. It can be understood that, as the input pattern changes, the simulated pattern 325 may change. So, at each iteration the simulated pattern 325 may be relatively different.

Procedure P317 includes determining whether the difference 327 between the simulated pattern 325 and the target pattern 302 is reduced or minimized. In an embodiment, the procedure P317 determines the difference 327 between the simulated pattern 325 and the target pattern 302 based on contours of a pattern. For example, determining the difference 327 between a target contour (e.g., geometric shapes) of the target pattern 302 and a simulated contour (e.g., geometric shapes) of the simulated pattern 313.

Responsive to the difference 327 being reduced or minimized, procedure P319 includes extracting polygon shapes from the modified post-OPC pattern 323 to generate the mask pattern 315. As mentioned herein, the target pattern 302, the post-OPC pattern, and/or the modified post-OPC pattern 323 may be a gray-scale pixelated image.

In an embodiment, the extracting of the polygon shapes from the modified post-OPC pattern 323 includes processing, via thresholding, an image of the modified post-OPC pattern 323 to detect edges associated with one or more features within the modified post-OPC pattern 323. For example, the thresholding includes a predetermined pixel intensity threshold value indicative of an edge or a contour within an image. In an embodiment, the pixel intensity values may range from 0 to 1, 0 to 100, etc. For example, if the range is 0 to 1, the pixel intensity threshold value may be 0.8, indicating any pixel having pixel intensity greater than 0.8 is considered as a part of the contour. Further, the procedure P319 includes generating the mask pattern 315 using the edges of the one or more features.

As mentioned earlier, the post-OPC pattern 310 or the modified post-OPC pattern 323 includes a main feature corresponding to the target feature. Optionally, the post-OPC pattern 310 or 323 includes at least one assist feature located around the main feature. In an embodiment, the extracted polygons include polygons associated with the main feature and optionally the at least one assist feature.

Figure 9A:
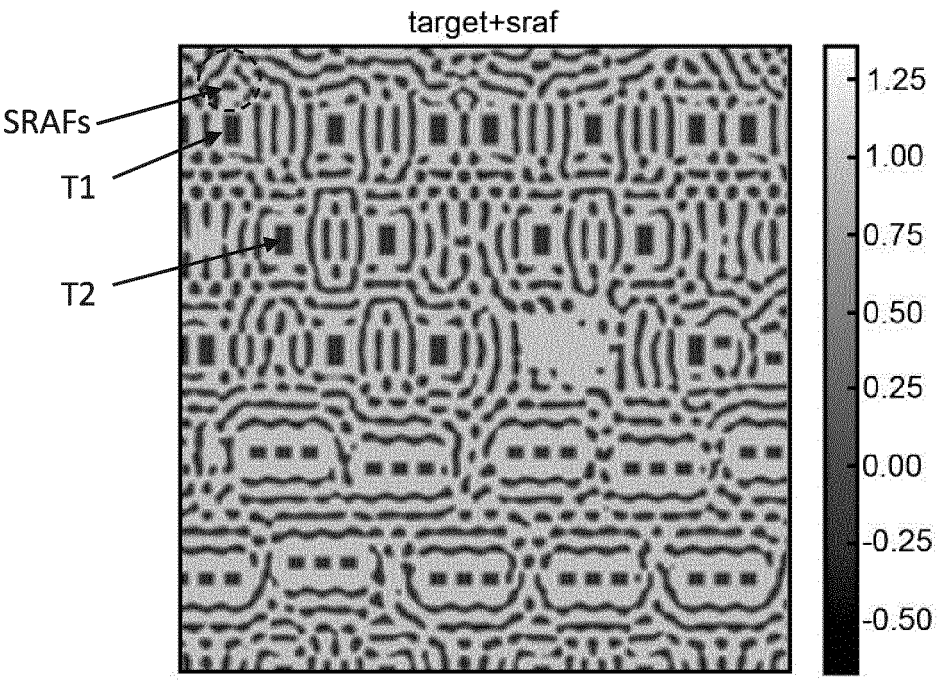
FIG. 9A is an example target pattern surrounded by assist features, according to an embodiment.
Figure 9B:
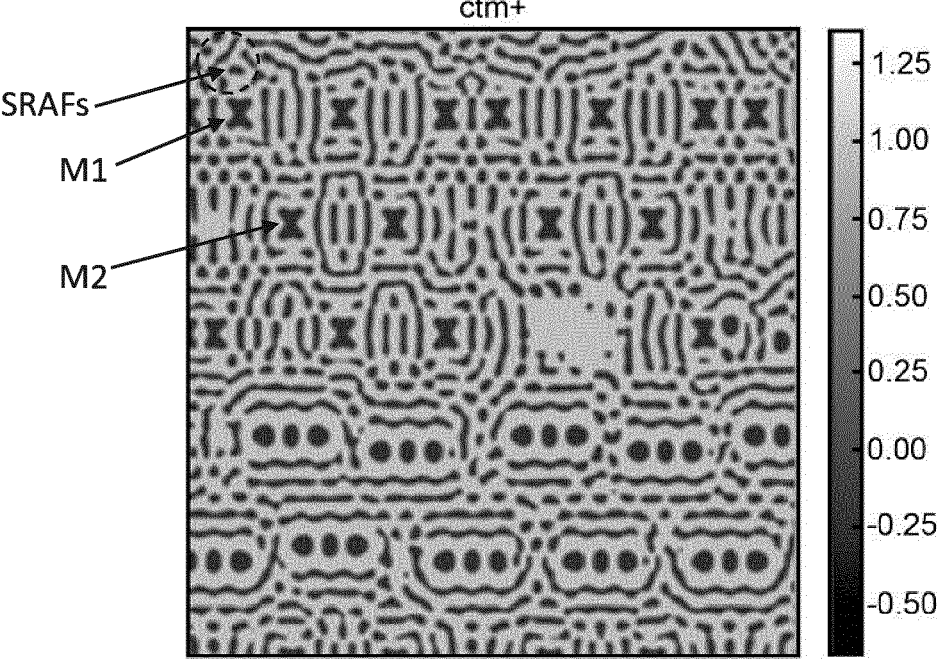
FIG. 9B is an example post-OPC pattern including assist features of FIG. 9A, according to an embodiment.

In case the post-OPC pattern 310 includes one or more assist features, such assist features are not modified in a second or a subsequent execution of the trained machine learning model 304 when the modified input pattern 321 is used. For example, as mentioned earlier, the assist features may be fixed or in a separate image which can be combined with the post-OPC image including the main features. For example, as shown in FIG. 9A, an input pattern includes a plurality of target feature (e.g., rectangles T1, T2) with each target feature being surrounded by curvilinear SRAFs. While FIG. 9B, shows an example post-OPC pattern (e.g., CTM+), having modified target feature also referred as main features (e.g., X-shaped) with the same curvilinear SRAFs as in FIG. 9A. Thus, in an embodiment, only main features corresponding to the target features are modified while SRAFs are fixed.

In an embodiment, the fixed assist feature (e.g., SRAF) may be modified. For example, in an extract polygon step, the assist feature may be modified based on a mask rule check (MRC) and sidelobe printing check. So, the assist feature may be changed in the extract polygon steps, but the assist feature may still remain fixed when applying the machine learning model to generate the post-OPC pattern. For example, in an embodiment, the trained machine learning model 304 may generate a modified main pattern, which can be further supplemented or combined with the assist feature (e.g., modified based on MRC). In an example, the trained machine learning model 304 may generate a modified main pattern and new assist features, these new assist features may be replaced by the modified assist feature (e.g., modified based on MRC).

Figure 4:
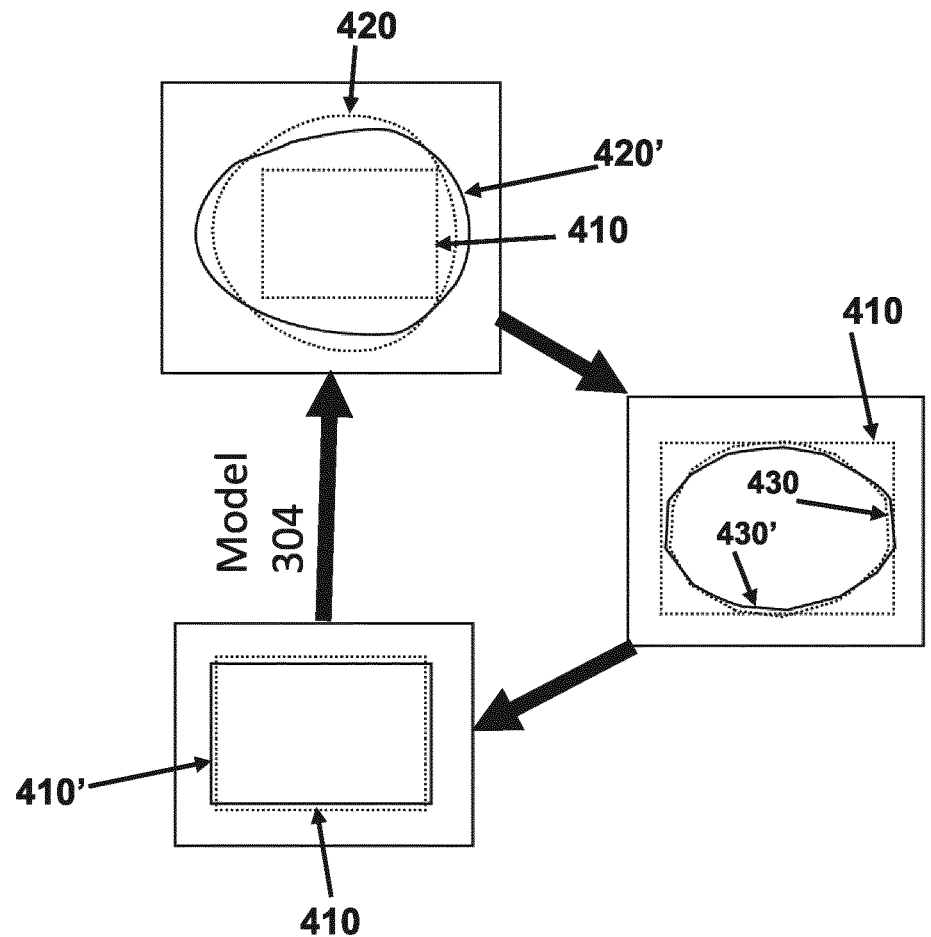
FIG. 4 is an example of generating the mask pattern according to the method of FIGS. 3A and 3B, according to an embodiment.

FIG. 4 illustrates an example of generating a mask pattern according to the method 300 discussed herein. As discussed in the method 300, an input pattern 410 can include a feature corresponding to a target feature. In a first iteration, the input pattern 410 can be a target pattern 410. The input pattern 410 can be inputted to the trained machine learning model (e.g., the model 304) to generate a post-OPC pattern 420. In the present example, the post-OPC pattern 420 is a curvilinear pattern, which is represented as a curvilinear polygon shape. Further, the post-OPC pattern 420 is inputted to a process model (e.g., a resist model) to generate a simulated pattern 430. In the present example, the simulated pattern 430 is represented as a curvilinear polygon. The simulated pattern 430 is overlaid on the target feature 410 for comparing how closely the simulated pattern 430 matches the target feature 410. In an embodiment, a difference between the patterns 430 and 410 is computed. Based on the difference, the input pattern is modified to generate the modified input pattern 410'. Again, the trained machine learning model is executed using the modified input pattern 410' to generate a different post-OPC pattern 420'. The post-OPC pattern 420' further generates, via the process model, the simulated pattern 430'. In an embodiment, it may be determined that the difference between the simulated pattern 430' and the target pattern 410. In this case, the post-OPC pattern 420' is considered as the final pattern. In an embodiment, a mask pattern is extracted from this post-OPC pattern 420'. For example, the mask pattern includes the polygonal shape 430' that is used to manufacture a mask and further employed in a lithographic apparatus (e.g., FIG. 1) to print the target pattern 410 on a substrate.

Figure 5:
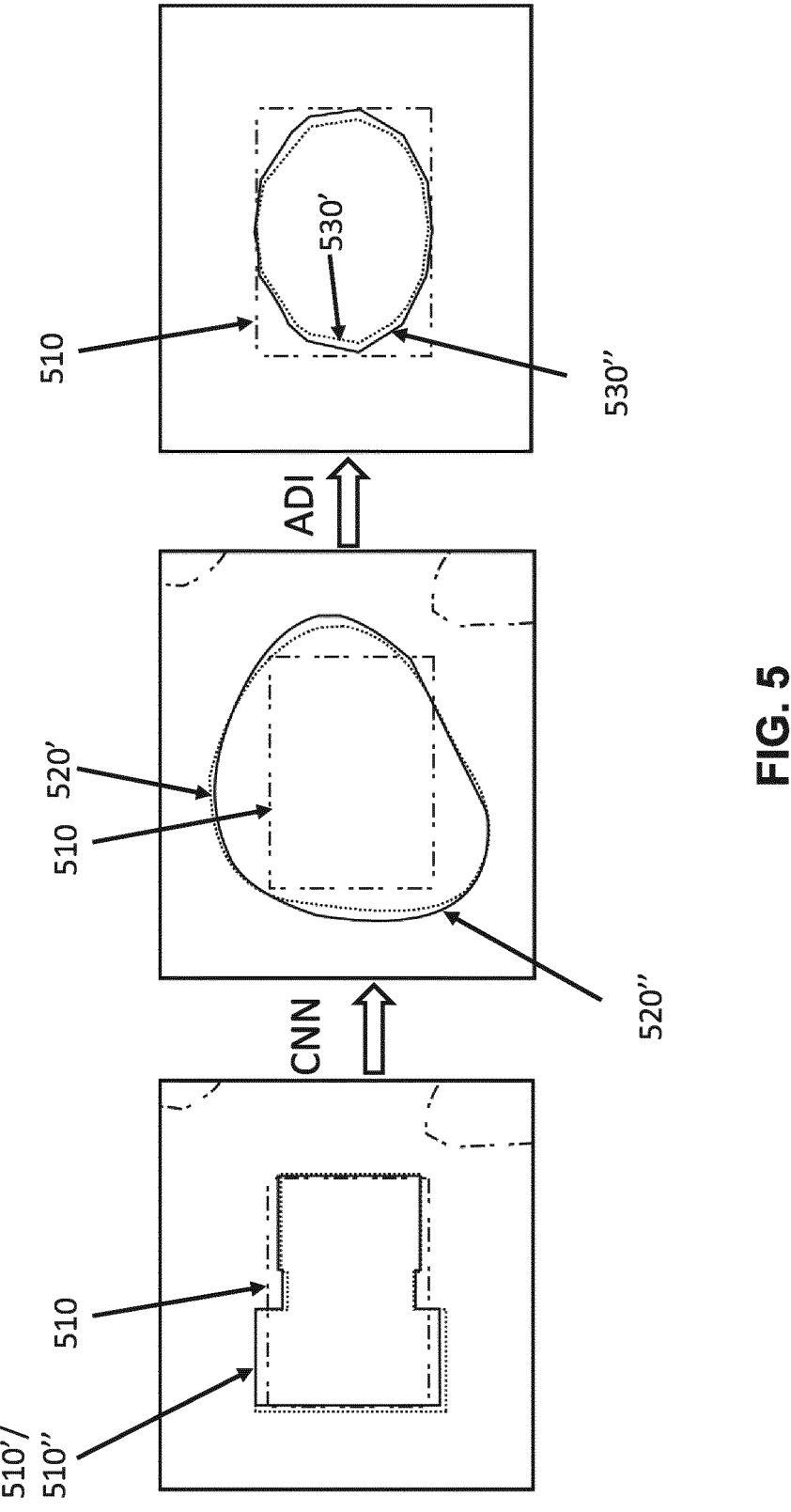
FIG. 5 illustrates a non-monotonic behavior of an existing trained machine learning model (e.g., a trained CNN) that is configured to generate an OPC pattern from any input pattern, according to an embodiment.
Figure 6:
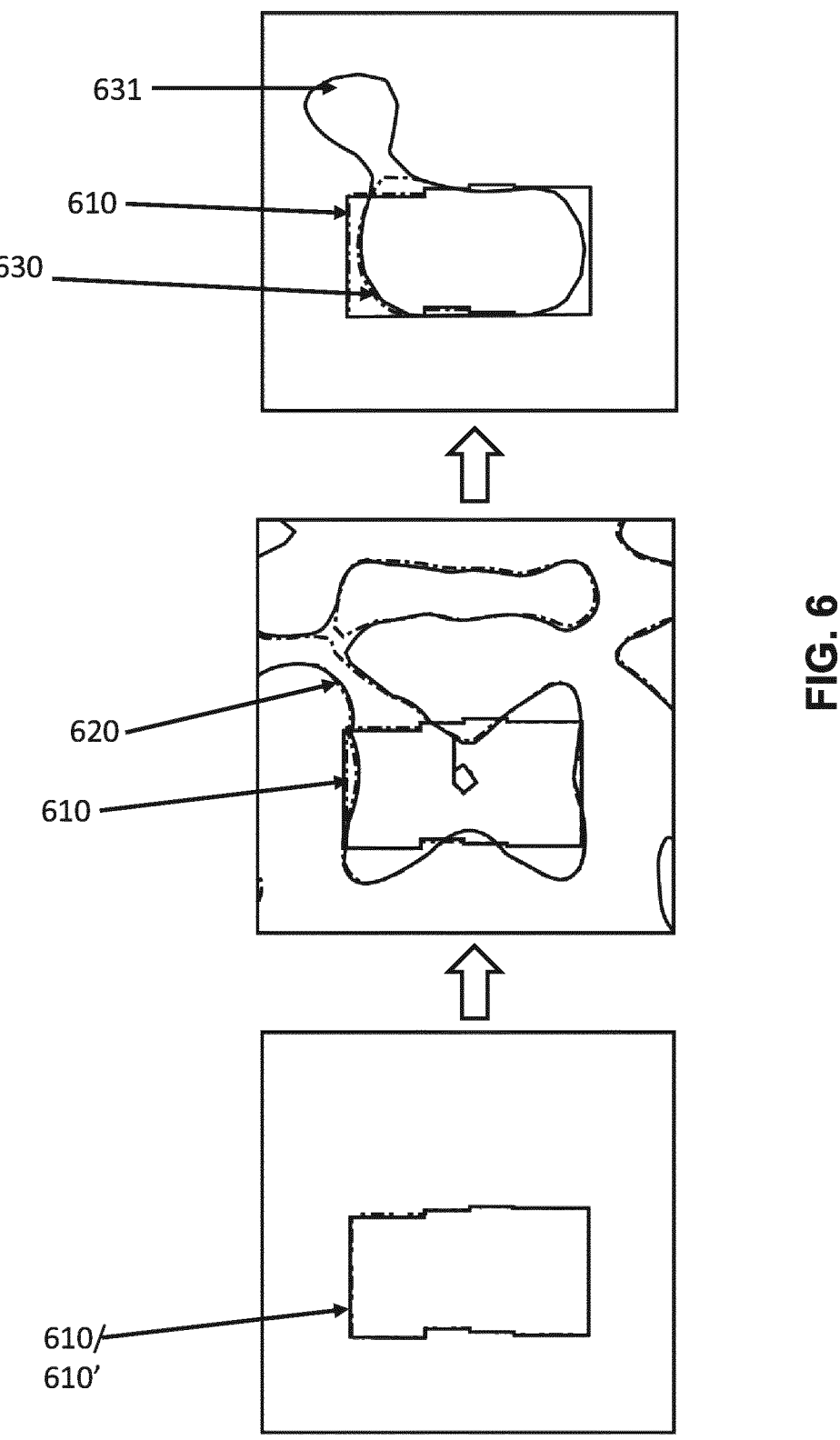
FIG. 6 illustrates an impact of small biasing of the target pattern on a resist pattern, according to an embodiment.

In an embodiment, FIGS. 5 and 6 illustrates example issues with existing machine learning model used to generate OPC patterns. For example, the existing CNN can be non-monotonic and a small perturbation in a target can result in a relatively large change in e.g., a resist contour. Hence, the present disclosure describes an improved training method for training a machine learning model in FIGS. 7A and 7B, so that the trained machine learning model generates more stable e.g., RI contours even if the target contours vary a little.

FIG. 5 illustrates a non-monotonic behavior of an existing trained machine learning model (e.g., a trained CNN) that is configured to generate an OPC pattern from any input pattern. According to an embodiment of the present disclosure, the non-monotonic behavior of the CNN model indicates an increase in size of an input pattern such as a biased target pattern results in a reduced the size of an OPC pattern generated by the trained CNN model. In an example, changing a relative size refers to increasing or decreasing a portion of a target contour with respect to the target contour. In an embodiment, the relative size can be increase or decrease in a circumference, an area, or other geometric properties.

In one example, a biased pattern 510' has an increased size, at a left edge, relative to the target pattern 510. Using such biased pattern 510' as the input, the trained CNN model generates an OPC pattern 520'. When a resist model (or other lithographic related process model) is executed using the OPC pattern 520', the resist model generates a resist contour 530'. The resist contour 530' has edges are drawn inwards or has reduced size compared to the target pattern 510, although the target pattern 510 was biased to increase the size, e.g., biased pattern 510'.

In another example, a biased pattern 510" has a reduced size, at the left edge, relative to the target pattern 510. Using such biased pattern 520" as an input, the trained CNN model generates a different OPC pattern 520". When a resist model (or other lithographic related process model) is executed using the OPC pattern 520", the resist model generates a resist contour 530". In this case, the resist contour 530" is closer to the edges of the target pattern 510, although the target pattern 510 was biased to decrease in size, e.g., biased pattern 510".

Comparing the OPC patterns 520' and 520" shows that although the target pattern 510 may be biased to increase (or decrease) in size, such changes are not translated monotonically via, the trained CNN model. While, comparing 520' and 530", a relatively smaller OPC pattern 520' causes a relatively smaller resist contour 530' and a relatively larger OPC pattern 520" causes a relatively larger resist pattern 530". Thus, a small perturbation in an input pattern, which is used by the trained CNN used to generate OPC patterns can result in undesired resist contours (e.g., resist contour not closely following the target pattern). Hence, a trained CNN model that generates a more stable and reliable outputs is desired so that relatively stable and reliable resist contours may be simulated.

FIG. 6 illustrates that a small bias on a target causes an existing CNN model to generate an OPC pattern that eventually results in a relatively large RI contour changes. FIG. 6 illustrates an example target contour 610 and slightly biased target contours 610'. In an example, one or more edges of the original target contour 610 may be biased (e.g., moved or modified) by single digit nanometer. The biased target pattern 610' can be used to generate an OPC pattern, from which a mask pattern may be derived. For example, a trained CNN model configured to generate OPC pattern using any input pattern can be used to generate the OPC pattern such as OPC pattern 620. For even a small change in the input pattern the OPC pattern 620 changes significantly. For example, as observed in the pattern 620, the curved lines vary so much that a single large polygonal shape may be created or two separate polygon shapes may be generated in response to a small bias in the input pattern (e.g., the target pattern 610). When the OPC pattern 620 is further used as input to a process model (e.g. a resist model of FIG. 2, any other lithographic, or any after development model), the process model generates a simulated pattern 630 (e.g., a resist pattern). Thus, depending on the variation in the OPC pattern 620, the resulting simulated pattern 630 (e.g., resist pattern) will change. For example, in an example, the simulated pattern 630 may closely follow the target contour 610. In another example, the simulated pattern 630 may include extra portion such as portion 631 in response to a different OPC pattern 620' resulting from a different biasing of the target contour 610. Such large changes in the simulated pattern 630 (e.g., the resist pattern) is undesirable, as it becomes difficult to converge to a unique mask patterns during e.g., a mask optimization process.

Figure 7A:
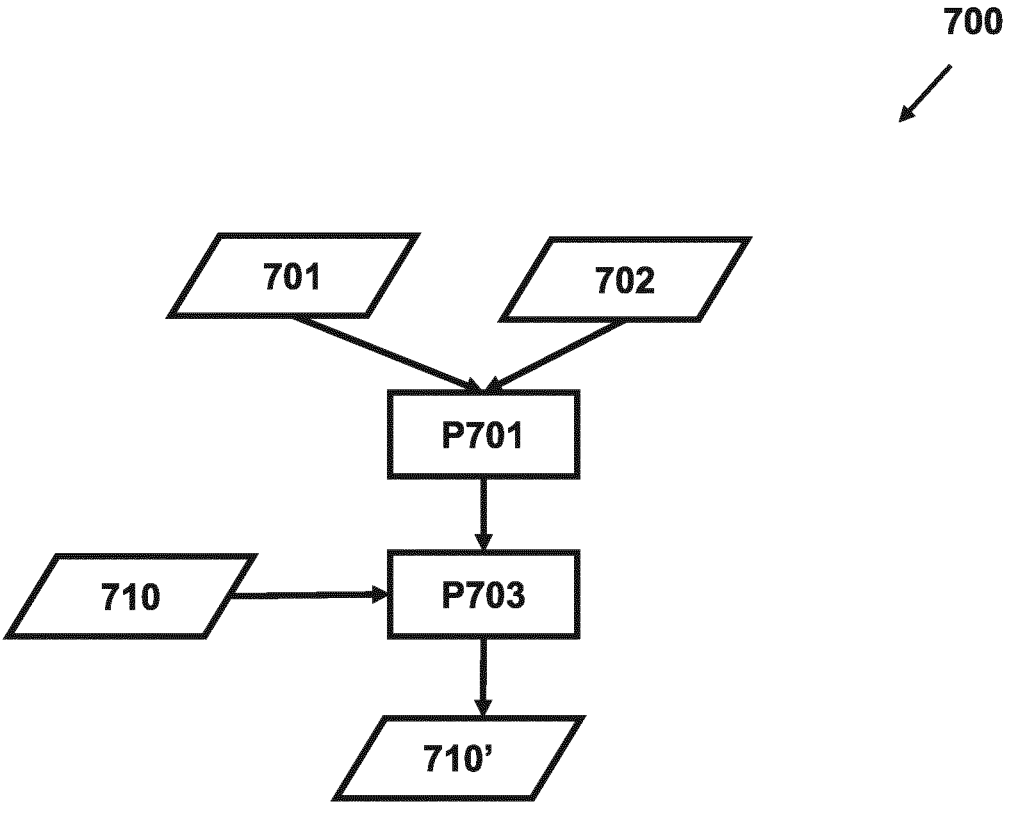
FIGS. 7A and 7B illustrate a flow chart of a method for training a machine learning model associated with a patterning process, according to an embodiment.
Figure 7B:
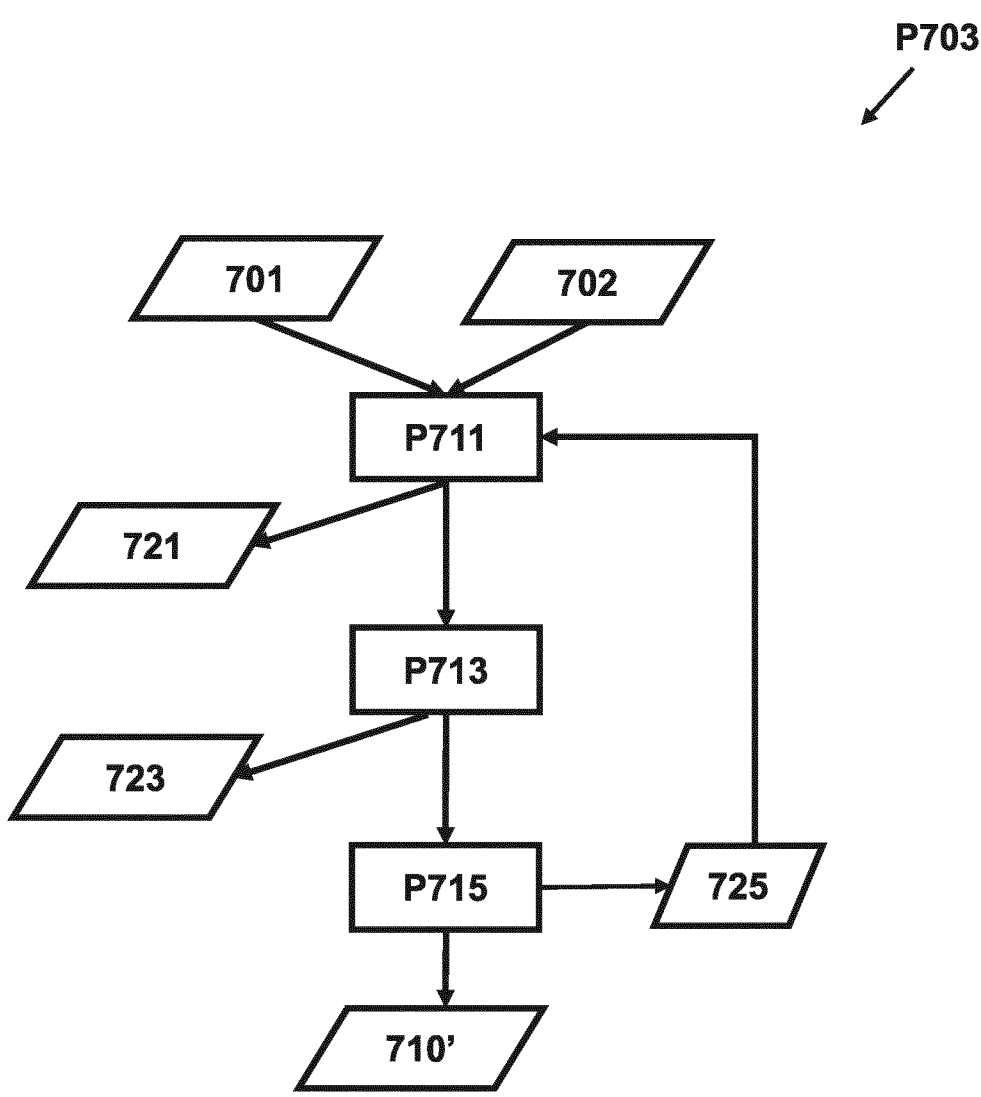

FIGS. 7A and 7B is an example flow chart of a method 700 of training a machine learning model 710 associated with a patterning process. The method 700 includes examples procedures P701 and P703 that may be implemented to train the machine learning model 710 to determine an OPC pattern, which can be further used to derive a mask pattern. At the end of the training process, the model 710 is referred as a trained machine learning model 710'. By way of example, the machine learning model 710 is a convolutional neural network (CNN), and the parameter is one or more weights of the CNN. However, the present disclosure is not limited to a particular type of machine learning model 710.

Procedure P701 includes obtaining a training data set comprising: (i) a set of perturbed target patterns 701 associated with a target pattern to be printed on a substrate, and (ii) a set of reference patterns 702, each reference pattern being associated with a particular perturbed target pattern of the set of perturbed target pattern. For example, a set of perturbed target patterns 701 includes a first perturbed pattern, a second, and a third perturbed pattern corresponding to a single target pattern. A set of reference patterns 702 (not shown) can include a first, a second, and a third reference pattern obtained for the first, the second, and the third perturbed pattern, respectively.

Figure 8:
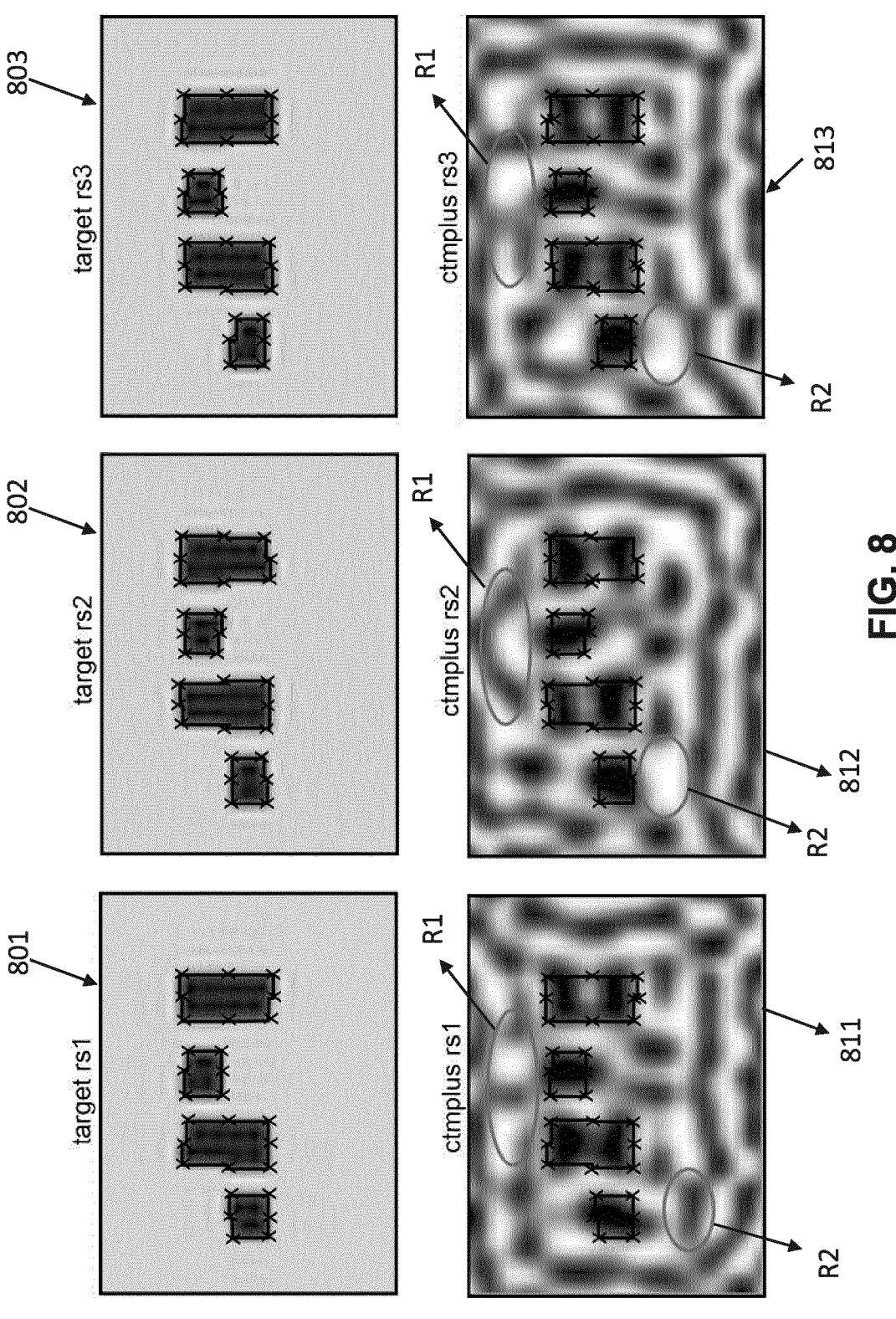
FIG. 8 illustrates sample perturbed target pattern and CTM+ images corresponding to each perturbed target pattern, according to an embodiment.

FIG. 8 illustrates three different perturbed target patterns 801, 802 and 803 having minor variations therebetween. The perturbed target patterns 801, 802, and 803 are generated from a single target pattern (not shown). For example, a first perturbed pattern may be obtained by perturbing or biasing a top edge of the target pattern, a second perturbed pattern may be obtained by perturbing or biasing a side edge of the target pattern, and a third perturbed pattern may be obtained by perturbing or biasing a bottom edge of the target pattern. It can be understood that the perturbation or biasing of the target pattern is not limited to a particular portion of the target pattern. Also, one or more portions may be perturbed simultaneously. In an embodiment, the perturbed patterns 801, 802 and 803 can be represented as grey-scale pixelated images, where a pixel intensity is indicative of presence or absence of an edge. In an embodiment, perturbed pattern images can be generated by e.g., rasterization of polygon shapes in a GDS file. Each of the perturbed patterns 801, 802 and 803 may be perturbed by changing positions of the control points (X-marks) placed along a contour of e.g., target features (solid outlines with X-marks).

FIG. 8 also illustrates example CTM+ images (also referred as CTM+ maps) generated by executing an OPC generation process. Examples of OPC generation processes are discussed in more detail in U.S. Pat. Nos. 8,584,056, 9,111,062, or described in Y. Shen, et al., Level-Set-Based Inverse Lithography For Photomask Synthesis, Optics Express, Vol. 17, pp. 23690-23701 (2009), the disclosures of which are hereby incorporated by reference in their entirety. The details of the existing OPC generation process are not discussed in detail for brevity. In the present example, the CTM+ image 811 is generated using the perturbed pattern 801, the CTM+ image 812 is generated using the perturbed pattern 802, and the CTM+ image 813 is generated using the perturbed pattern 803. Observe that each CTM+ images show substantially different assist features e.g., in regions R1 and R2 of each image 811, 812, and 813. These CTM+ images are further used to extract mask patterns. This indicates that even for small perturbations in an input pattern (e.g., represented as an input image 801) may generate different mask patterns.

In an embodiment, the procedure P701 of obtaining the training data set includes generating a reference pattern by executing an OPC process (e.g., CTM, CTM+) using the target pattern as an input pattern; perturbing at least a portion of the target pattern to generate a plurality of perturbed target patterns; and generating, via executing the OPC process using the plurality of perturbed target patterns as the input, a plurality of reference patterns. As mentioned herein, the perturbing of the target pattern comprises biasing at least a portion of an edge of the target pattern. In an embodiment, the perturbing can be a random perturbing. For example, a randomly selected portion of the target pattern is biased by a random value of the order of a single nanometer.

In an embodiment, the reference pattern is a post-OPC pattern including a main feature corresponding to a target feature of the target pattern. In an embodiment, the reference patterns correspond to the perturbed pattern. For example, in FIG. 8, the each perturbed pattern 801, 802, and 803 includes target features (dark/black portions or rectangular shapes) and each of CTM+ patterns 811, 812, and 813 includes main features corresponding to the target features of the perturbed patterns 801, 802, and 803, respectively.

In an embodiment, the obtaining of the training data set further includes extracting the at least one assist feature from the reference pattern associated with the target pattern; and generating, via executing the OPC process using the plurality of perturbed target patterns (e.g., 801, 802, 803) as the input and keeping the extracted assist feature fixed, the plurality of reference patterns. Each reference pattern of the plurality of reference patterns has the same extracted assist feature.

In an example, each reference pattern of the set of reference patterns 702 are a modified version of a post optical proximity correction (post-OPC) pattern, where the post-OPC pattern is modified to includes a same assist feature around the main features of the respective reference patterns. For example, the reference pattern may be generated by (i) extracting main features from the CTM+ patterns 811, 812, and 813, (ii) extracting assist features (e.g., SRAFs) from a CTM+ pattern generated using an unperturbed target pattern (not shown), and (iii) placing the assist features of (ii) around the main features of (i), so that each reference pattern has the same assist features.

In an embodiment, extracting the main feature or assist feature comprises extracting polygon shapes from a post-OPC pattern. For example, the extracting includes thresholding an image (e.g., CTM+ image) to detect edges associated with one or more main features and/or one or more assist feature within the post-OPC patterns.

Procedure P703 includes training, using the training data set, the machine learning model 710 to generate a post-OPC pattern such that the model-generated post-OPC pattern is tailored to match a particular reference pattern of the set of reference patterns 702. In an embodiment, the match between the model-generated post-OPC pattern and the particular reference pattern is identical. In an embodiment, the match may be more than 95%, or preferably more than 99%.

In an embodiment, the training of the machine learning model 710 is an iterative process. In an embodiment, each iteration includes procedures P711, P713, and P713. Procedure P711 includes executing, using a perturbed target pattern of the set of perturbed patterns 701 as the input, the machine learning model 710 to generate a post-OPC pattern 721. Procedure P713 includes determining a difference 723 between the model-generated post-OPC pattern 721 and a reference pattern of the set of reference patterns 702 associated with the perturbed target pattern. Procedure P715 includes modifying, based on the difference 723, a parameter 725 of the machine learning model 710 so that the difference 723 is reduced or minimized. In an embodiment, the parameter 725 of the machine learning model 710 e.g., CNN includes one or more weights and/or biases associated with one or more layers of the e.g., CNN.

In an embodiment, the weights of the machine learning model 710 are adjusted based on a gradient decent of the difference 723 between the model-generated post-OPC pattern and a reference pattern. In an embodiment, the weights may be adjusted based on other optimization methods that minimizes the difference 723. It can be understood by a person skilled in the art that the present disclosure is not limited to gradient decent method, and other appropriate approaches may be used that can guide how to adjust weights so that the difference between the predicted image and the reference image is reduced. In an embodiment, training is performed until the difference between the predicted image and the reference image is minimized.

According to present disclosure, the combination and sub-combinations of disclosed elements constitute separate embodiments. For example, a first combination includes determining a mask pattern using a target pattern or a separately generated post-OPC pattern. A second combination determining a mask pattern by extracting polygons from the post-OPC pattern generated via the trained machine learning model. In another combination, a lithographic apparatus comprises a mask manufacturing using the mask pattern determined as discussed herein.

In an embodiment, the methods (e.g., 300 and 700) discussed herein may be provided as a computer program product or a non-transitory computer readable medium having instructions recorded thereon, the instructions when executed by a computer implementing the operation of the methods 300 and 700 discussed above.

Figure 14:
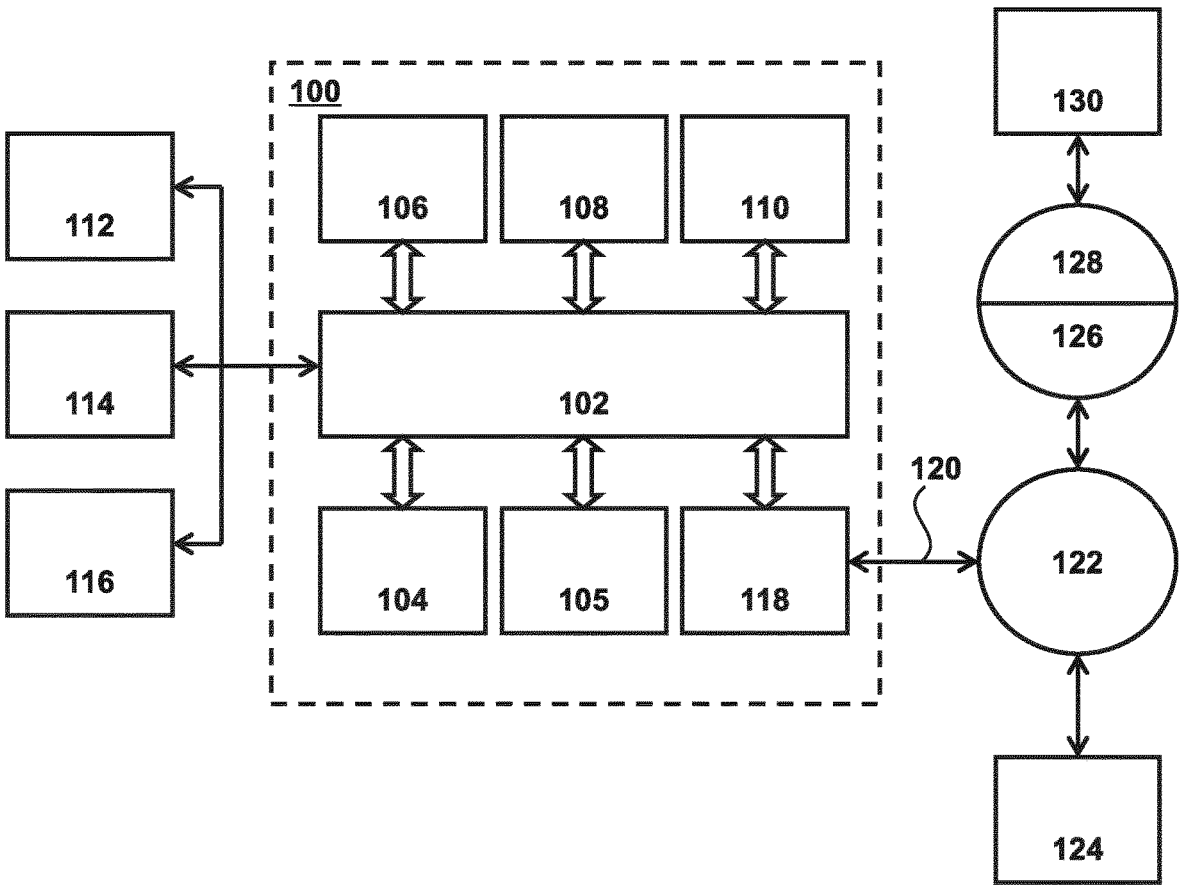
FIG. 14 is a block diagram of an example computer system, according to an embodiment.

For example, an example computer system 100 in FIG. 14 includes a non-transitory computer-readable media (e.g., memory) comprising instructions that, when executed by one or more processors (e.g., 104), cause operations including In an embodiment, a non-transitory computer-readable media comprising instructions that, when executed by one or more processors, cause operations comprising: obtaining, via executing a model using a target pattern to be printed on a substrate as an input pattern, a post optical proximity correction (post-OPC) pattern; determining, based on the post-OPC pattern, a simulated pattern that will be printed on the substrate; and determining the mask pattern based on a difference between the simulated pattern and the target pattern. The determining the mask pattern comprises: modifying, based on the difference, the input pattern inputted to the model such that the difference is reduced; and executing, using the modified input pattern, the model to generate a modified post-OPC pattern from which the mask pattern can be derived.

In an embodiment, the model is a trained machine learning model configured to generate a post-OPC pattern for an input pattern.

In an embodiment, the determining of the mask pattern is an iterative process, each iteration comprises: modifying, based on a gradient of the difference, at least a portion of the input pattern to reduce the difference between the target pattern and the simulated pattern, the gradient being indicative of how the target pattern be modified to reduce or minimize the difference; executing, using the modified input pattern, the trained machine learning model to generate the modified post-OPC pattern; determining the simulated pattern based on the modified post-OPC pattern; determining whether the difference between the simulated pattern and the target pattern is reduced or minimized; and responsive to the difference being reduced or minimized, extracting polygon shapes from the modified post-OPC pattern to generate the mask pattern.

In an embodiment, the at least a portion of the input pattern comprises a contour corresponding to a target feature within the target pattern.

In an embodiment, the determining of the difference the simulated pattern and the target pattern comprises: determining the difference between a target contour of the target pattern and a simulated contour of the simulated pattern.

In an embodiment, the modifying of the input pattern comprises: modifying, based on the gradient of the difference, the contour of the input pattern to reduce the difference between the target contour and the simulated contour, the gradient being indicative of how the contour of the input pattern be modified to reduce or minimize the difference.

In an embodiment, the modifying of the input pattern comprises: assigning control points on the target contour; and adjusting, based on the gradient of the difference, a position of one or more control point such that the difference is reduced or minimized.

In an embodiment, the gradient is a differential of the difference with respect to the control points, the gradient indicating a change in the difference due a change in a position of a control point.

In an embodiment, the determining of the simulated pattern comprises: executing a process model of the patterning process using the post-OPC pattern or the modified post-OPC pattern to generate a simulated pattern.

In an embodiment, the extracting of the polygon shapes from the modified post-OPC pattern comprises: processing, via thresholding, an image of the modified post-OPC pattern to detect edges associated with one or more features within the modified post-OPC pattern; and generating the mask pattern using the edges of the one or more features.

In an embodiment, the post-OPC pattern or the modified post-OPC pattern comprises: a main feature corresponding to the target feature, and optionally at least one assist feature located around the main feature.

In an embodiment, the at least one assist feature is not modified in a second or a subsequent execution of the trained machine learning model when the modified input pattern is used.

In an embodiment, the extracted polygons include polygons associated with the main feature and optionally the at least one assist feature.

In an embodiment, the target pattern, the post-OPC pattern, and/or the modified post-OPC pattern is a gray-scale pixelated image.

In an embodiment, the process model is an after development process model, and the simulated pattern is an after development image.

In an embodiment, the process model is a resist model and the simulated pattern is a resist pattern.

In an embodiment, a non-transitory computer-readable media comprising instructions that, when executed by one or more processors, cause operations comprising: obtaining a training data set comprising: (i) a set of perturbed target patterns associated with a target pattern to be printed on a substrate, and (ii) a set of reference patterns, each reference pattern being associated with a particular perturbed target pattern of the set of perturbed target pattern; and training, using the training data set, the machine learning model to generate a post-OPC pattern such that the model-generated post-OPC pattern tailored to match a particular reference pattern of the set of reference patterns.

In an embodiment, the obtaining of the training data set comprises: generating, via executing an OPC process using the target pattern as an input, a reference pattern, the reference pattern being a post-OPC pattern comprising a main feature corresponding to a target feature of the target pattern; perturbing at least a portion of the target pattern to generate a plurality of perturbed target patterns; and generating, via executing the OPC process using the plurality of perturbed target patterns as the input, a plurality of reference patterns.

In an embodiment, the training of the machine learning model is an iterative process, each iteration comprises: executing, using a perturbed target pattern of the set of perturbed patterns as the input, the machine learning model to generate a post-OPC pattern; determining a difference between the model-generated post-OPC pattern and a reference pattern of the set of reference patterns associated with the perturbed target pattern; and modifying, based on the difference, a parameter of the machine learning model so that the difference is reduced or minimized.

In an embodiment, the machine learning model is a convolutional neural network (CNN), and the parameter is one or more weights of the CNN.

In an embodiment, the match between the model-generated post-OPC pattern and the particular reference pattern is identical.

In an embodiment, each reference pattern being a post optical proximity correction (post-OPC) pattern includes a same assist feature.

In an embodiment, the obtaining of the training data set further comprises: extracting the at least one assist feature from the reference pattern; and generating, via executing the OPC process using the plurality of perturbed target patterns as the input and keeping the extracted assist feature fixed, the plurality of reference patterns, wherein each reference pattern of the plurality of reference patterns has the extracted assist feature.

It is noted that the terms "mask", "reticle", "patterning device" are utilized interchangeably herein. Also, person skilled in the art will recognize that, especially in the context of lithography simulation/optimization, the term "mask"/ "patterning device" and "design layout" can be used interchangeably, as in lithography simulation/optimization, a physical patterning device is not necessarily used but a design layout can be used to represent a physical patterning device. For the small feature sizes and high feature densities present on some design layout, the position of a particular edge of a given feature will be influenced to a certain extent by the presence or absence of other adjacent features. These proximity effects arise from minute amounts of radiation coupled from one feature to another and/or non-geometrical optical effects such as diffraction and interference. Similarly, proximity effects may arise from diffusion and other chemical effects during post-exposure bake (PEB), resist development, and etching that generally follow lithography.

In order to ensure that the projected image of the design layout is in accordance with requirements of a given target circuit design, proximity effects need to be predicted and compensated for, using sophisticated numerical models, corrections or pre-distortions of the design layout. The article "Full-Chip Lithography Simulation and Design Analysis—How OPC Is Changing IC Design", C. Spence, Proc. SPIE, Vol. 5751, pp 1-14 (2005) provides an overview of current "model-based" optical proximity correction processes. In a typical high-end design almost every feature of the design layout has some modification in order to achieve high fidelity of the projected image to the target design. These modifications may include shifting or biasing of edge positions or line widths as well as application of "assist" features that are intended to assist projection of other features.

Application of model-based OPC to a target design involves good process models and considerable computational resources, given the many millions of features typically present in a chip design. However, applying OPC is generally not an "exact science", but an empirical, iterative process that does not always compensate for all possible proximity effect. Therefore, effect of OPC, e.g., design layouts after application of OPC and any other RET, need to be verified by design inspection, i.e. intensive full-chip simulation using calibrated numerical process models, in order to minimize the possibility of design flaws being built into the patterning device pattern. This is driven by the enormous cost of making high-end patterning devices, which run in the multi-million dollar range, as well as by the impact on turn-around time by reworking or repairing actual patterning devices once they have been manufactured.

Both OPC and full-chip RET verification may be based on numerical modeling systems and methods as described, for example in, U.S. patent application Ser. No. 10/815,573 and an article titled "Optimized Hardware and Software For Fast, Full Chip Simulation", by Y. Cao et al., Proc. SPIE, Vol. 5754, 405 (2005).

One RET is related to adjustment of the global bias of the design layout. The global bias is the difference between the patterns in the design layout and the patterns intended to print on the substrate. For example, a circular pattern of 25 nm diameter may be printed on the substrate by a 50 nm diameter pattern in the design layout or by a 20 nm diameter pattern in the design layout but with high dose.

In addition to optimization to design layouts or patterning devices (e.g., OPC), the illumination source can also be optimized, either jointly with patterning device optimization or separately, in an effort to improve the overall lithography fidelity. The terms "illumination source" and "source" are used interchangeably in this document. Since the 1990s, many off-axis illumination sources, such as annular, quadrupole, and dipole, have been introduced, and have provided more freedom for OPC design, thereby improving the imaging results, As is known, off-axis illumination is a proven way to resolve fine structures (i.e., target features) contained in the patterning device. However, when compared to a traditional illumination source, an off-axis illumination source usually provides less radiation intensity for the aerial image (AI). Thus, it becomes desirable to attempt to optimize the illumination source to achieve the optimal balance between finer resolution and reduced radiation intensity.

Numerous illumination source optimization approaches can be found, for example, in an article by Rosenbluth et al., titled "Optimum Mask and Source Patterns to Print A Given Shape", Journal of Microlithography, Microfabrication, Microsystems 1(1), pp. 13-20, (2002). The source is partitioned into several regions, each of which corresponds to a certain region of the pupil spectrum. Then, the source distribution is assumed to be uniform in each source region and the brightness of each region is optimized for process window. However, such an assumption that the source distribution is uniform in each source region is not always valid, and as a result the effectiveness of this approach suffers. In another example set forth in an article by Granik, titled "Source Optimization for Image Fidelity and Throughput", Journal of Microlithography, Microfabrication, Microsystems 3(4), pp. 509-522, (2004), several existing source optimization approaches are overviewed and a method based on illuminator pixels is proposed that converts the source optimization problem into a series of non-negative least square optimizations. Though these methods have demonstrated some successes, they typically require multiple complicated iterations to converge. In addition, it may be difficult to determine the appropriate/optimal values for some extra parameters, such as $\gamma$ in Granik's method, which dictates the trade-off between optimizing the source for substrate image fidelity and the smoothness requirement of the source.

For low $k_1$ photolithography, optimization of both the source and patterning device is useful to ensure a viable process window for projection of critical circuit patterns. Some algorithms (e.g. Socha et. al. Proc. SPIE vol. 5853, 2005, p. 180) discretize illumination into independent source points and mask into diffraction orders in the spatial frequency domain, and separately formulate a cost function (which is defined as a function of selected design variables) based on process window metrics such as exposure latitude which could be predicted by optical imaging models from source point intensities and patterning device diffraction orders. The term "design variables" as used herein comprises a set of parameters of a lithographic projection apparatus or a lithographic process, for example, parameters a user of the lithographic projection apparatus can adjust, or image characteristics a user can adjust by adjusting those parameters. It should be appreciated that any characteristics of a lithographic projection process, including those of the source, the patterning device, the projection optics, and/or resist characteristics can be among the design variables in the optimization. The cost function is often a non-linear function of the design variables. Then standard optimization techniques are used to minimize the cost function.

Relatedly, the pressure of ever decreasing design rules have driven semiconductor chipmakers to move deeper into the low $k_1$ lithography era with existing 193 nm ArF lithography. Lithography towards lower $k_1$ puts heavy demands on RET, exposure tools, and the need for litho-friendly design. 1.35 ArF hyper numerical aperture (NA) exposure tools may be used in the future. To help ensure that circuit design can be produced on to the substrate with workable process window, source-patterning device optimization (referred to herein as source-mask optimization or SMO) is becoming a significant RET for 2×nm node.

A source and patterning device (design layout) optimization method and system that allows for simultaneous optimization of the source and patterning device using a cost function without constraints and within a practicable amount of time is described in a commonly assigned International Patent Application No. PCT/US2009/065359, filed on Nov. 20, 2009, and published as WO2010/059954, titled "Fast Freeform Source and Mask Co-Optimization Method", which is hereby incorporated by reference in its entirety.

Another source and mask optimization method and system that involves optimizing the source by adjusting pixels of the source is described in a commonly assigned U.S. patent application Ser. No. 12/813,456, filed on Jun. 10, 2010, and published as U.S. Patent Application Publication No. 2010/0315614, titled "Source-Mask Optimization in Lithographic Apparatus", which is hereby incorporated by reference in its entirety.

In a lithographic projection apparatus, as an example, a cost function is expressed as $$CF(z_1, z_2, \ldots , z_N) = \sum_{p=1}^{P} w_p f_p^2(z_1, z_2, \ldots , z_N) \qquad \text{(Eq. 1)}$$

wherein $(z_1, z_2, \ldots , z_N)$ are N design variables or values thereof. $f_p(z_1, z_2, \ldots , z_N)$ can be a function of the design variables $(z_1, z_2, \ldots , z_N)$ such as a difference between an actual value and an intended value of a characteristic at an evaluation point for a set of values of the design variables of $(z_1, z_2, \ldots , z_N)$. $w_p$ is a weight constant associated with $f_p(z_1, z_2, \ldots , z_N)$. An evaluation point or pattern more critical than others can be assigned a higher $w_p$ value. Patterns and/or evaluation points with larger number of occurrences may be assigned a higher $w_p$ value, too. Examples of the evaluation points can be any physical point or pattern on the substrate, any point on a virtual design layout, or resist image, or aerial image, or a combination thereof. $f_p(z_1, z_2, \ldots , z_N)$ can also be a function of one or more stochastic effects such as the LWR, which are functions of the design variables $(z_1, z_2, \ldots , z_N)$. The cost function may represent any suitable characteristics of the lithographic projection apparatus or the substrate, for instance, failure rate of a feature, focus, CD, image shift, image distortion, image rotation, stochastic effects, throughput, CDU, or a combination thereof. CDU is local CD variation (e.g., three times of the standard deviation of the local CD distribution). CDU may be interchangeably referred to as LCDU. In one embodiment, the cost function represents (i.e., is a function of) CDU, throughput, and the stochastic effects. In one embodiment, the cost function represents (i.e., is a function of) EPE, throughput, and the stochastic effects. In one embodiment, the design variables $(z_1, z_2, \ldots , z_N)$ comprise dose, global bias of the patterning device, shape of illumination from the source, or a combination thereof. Since it is the resist image that often dictates the circuit pattern on a substrate, the cost function often includes functions that represent some characteristics of the resist image. For example, $f_p(z_1, z_2, \ldots, z_N)$ of such an evaluation point can be simply a distance between a point in the resist image to an intended position of that point (i.e., edge placement error $EPE_p(z_1, z_2, \ldots, z_N)$). The design variables can be any adjustable parameters such as adjustable parameters of the source, the patterning device, the projection optics, dose, focus, etc. The projection optics may include components collectively called as "wavefront manipulator" that can be used to adjust shapes of a wavefront and intensity distribution and/or phase shift of the irradiation beam. The projection optics preferably can adjust a wavefront and intensity distribution at any location along an optical path of the lithographic projection apparatus, such as before the patterning device, near a pupil plane, near an image plane, near a focal plane. The projection optics can be used to correct or compensate for certain distortions of the wavefront and intensity distribution caused by, for example, the source, the patterning device, temperature variation in the lithographic projection apparatus, thermal expansion of components of the lithographic projection apparatus. Adjusting the wavefront and intensity distribution can change values of the evaluation points and the cost function. Such changes can be simulated from a model or actually measured. Of course, CF $(z_1, z_2, \ldots, z_N)$ is not limited the form in Eq. 1. CF $(z_1, z_2, \ldots, z_N)$ can be in any other suitable form.

It should be noted that the normal weighted root mean square (RMS) of $f_p(z_1, z_2, \ldots, z_N)$ is defined as $$\sqrt{\frac{1}{P}\sum_{p=1}^{P} w_p f_p^2(z_1, z_2, \ldots, z_N)},$$

therefore, minimizing the weighted RMS of $f_p(z_1, z_2, \ldots, z_N)$ is equivalent to minimizing the cost function $$CF(z_1, z_2, \ldots, z_N) = \sum_{p=1}^{P} w_p f_p^2(z_1, z_2, \ldots, z_N),$$

defined in Eq. 1. Thus the weighted RMS of $f_p(z_1, z_2, \ldots, z_N)$ and Eq. 1 may be utilized interchangeably for notational simplicity herein.

Further, if considering maximizing the PW (Process Window), one can consider the same physical location from different PW conditions as different evaluation points in the cost function in (Eq. 1). For example, if considering N PW conditions, then one can categorize the evaluation points according to their PW conditions and write the cost functions as:

$$CF(z_1, z_2, \ldots, z_N) = \tag{Eq. 1'}$$

$$\sum_{p=1}^{P} w_p f_p^2(z_1, z_2, \ldots, z_N) = \sum_{u=1}^{U}\sum_{p_u=1}^{P_u} w_{p_u} f_{p_u}^2(z_1, z_2, \ldots, z_N)$$

Where $f_{p_u}(z_1, z_2, \ldots, z_N)$ is the value of $f_p(z_1, z_2, \ldots, z_N)$ under the u-th PW condition u=1, . . . , U. When $f_p(z_1, z_2, \ldots, z_N)$ is the EPE, then minimizing the above cost function is equivalent to minimizing the edge shift under various PW conditions, thus this leads to maximizing the PW. In particular, if the PW also consists of different mask bias, then minimizing the above cost function also includes the minimization of MEEF (Mask Error Enhancement Factor), which is defined as the ratio between the substrate EPE and the induced mask edge bias.

The design variables may have constraints, which can be expressed as $(z_1, z_2, \ldots, z_N) \in Z$, where Z is a set of possible values of the design variables. One possible constraint on the design variables may be imposed by a desired throughput of the lithographic projection apparatus. The desired throughput may limit the dose and thus has implications for the stochastic effects (e.g., imposing a lower bound on the stochastic effects). Higher throughput generally leads to lower dose, shorter longer exposure time and greater stochastic effects. Consideration of substrate throughput and minimization of the stochastic effects may constrain the possible values of the design variables because the stochastic effects are function of the design variables. Without such a constraint imposed by the desired throughput, the optimization may yield a set of values of the design variables that are unrealistic. For example, if the dose is among the design variables, without such a constraint, the optimization may yield a dose value that makes the throughput economically impossible. However, the usefulness of constraints should not be interpreted as a necessity. The throughput may be affected by the failure rate based adjustment to parameters of the patterning process. It is desirable to have lower failure rate of the feature while maintaining a high throughput. Throughput may also be affected by the resist chemistry. Slower resist (e.g., a resist that requires higher amount of light to be properly exposed) leads to lower throughput. Thus, based on the optimization process involving failure rate of a feature due to resist chemistry or fluctuations, and dose requirements for higher throughput, appropriate parameters of the patterning process may be determined.

The optimization process therefore is to find a set of values of the design variables, under the constraints $(z_1, z_2, \ldots, z_N) \in Z$, that minimize the cost function, i.e., to find $$(\tilde{z}_1, \tilde{z}_2, \ldots, \tilde{z}_N) = \underset{(z_1, z_2, \ldots, z_N) \in Z}{\operatorname{argmin}} CF(z_1, z_2, \ldots, z_N) = \tag{Eq. 2}$$

$$\underset{(z_1, z_2, \ldots, z_N) \in Z}{\operatorname{argmin}} \sum_{p=1}^{P} w_p f_p^2(z_1, z_2, \ldots, z_N)$$

Figure 10:
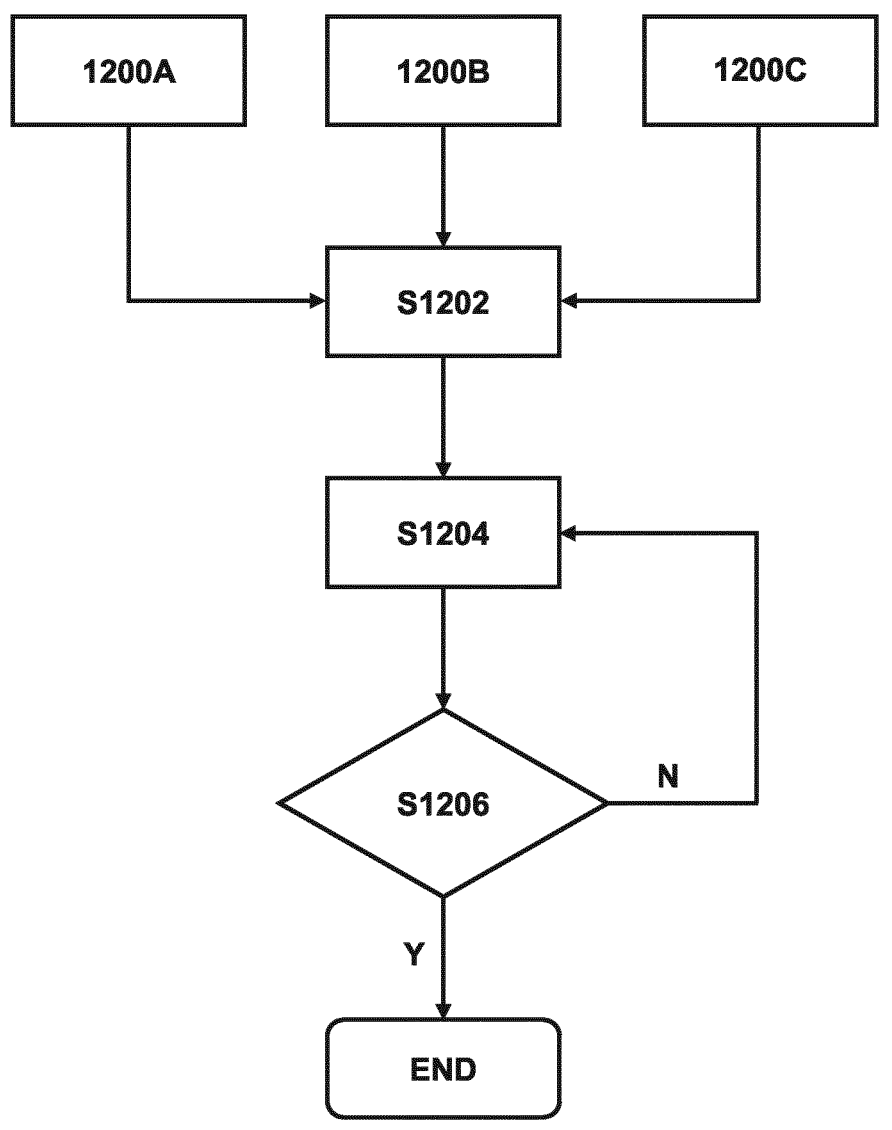
FIG. 10 is a flow diagram illustrating aspects of an example methodology of joint optimization, according to an embodiment.

A general method of optimizing the lithography projection apparatus, according to an embodiment, is illustrated in FIG. 10. This method comprises a step S1202 of defining a multi-variable cost function of a plurality of design variables. The design variables may comprise any suitable combination selected from characteristics of the illumination source (1200A) (e.g., pupil fill ratio, namely percentage of radiation of the source that passes through a pupil or aperture), characteristics of the projection optics (1200B) and characteristics of the design layout (1200C). For example, the design variables may include characteristics of the illumination source (1200A) and characteristics of the design layout (1200C) (e.g., global bias) but not characteristics of the projection optics (1200B), which leads to an SMO. Alternatively, the design variables may include characteristics of the illumination source (1200A), characteristics of the projection optics (1200B) and characteristics of the design layout (1200C), which leads to a source-mask-lens optimization (SMLO). In step S1204, the design variables are simultaneously adjusted so that the cost function is moved towards convergence. In step S1206, it is determined whether a predefined termination condition is satisfied. The predetermined termination condition may include various possibilities, i.e. the cost function may be minimized or maximized, as required by the numerical technique used, the value of the cost function has been equal to a threshold value or has crossed the threshold value, the value of the cost function has reached within a preset error limit, or a preset number of iteration is reached. If either of the conditions in step S1206 is satisfied, the method ends. If none of the conditions in step S1206 is satisfied, the step S1204 and S1206 are iteratively repeated until a desired result is obtained. The optimization does not necessarily lead to a single set of values for the design variables because there may be physical restraints caused by factors such as the failure rates, the pupil fill factor, the resist chemistry, the throughput, etc. The optimization may provide multiple sets of values for the design variables and associated performance characteristics (e.g., the throughput) and allows a user of the lithographic apparatus to pick one or more sets.

In a lithographic projection apparatus, the source, patterning device and projection optics can be optimized alternatively (referred to as Alternative Optimization) or optimized simultaneously (referred to as Simultaneous Optimization). The terms "simultaneous", "simultaneously", "joint" and "jointly" as used herein mean that the design variables of the characteristics of the source, patterning device, projection optics and/or any other design variables, are allowed to change at the same time. The term "alternative" and "alternatively" as used herein mean that not all of the design variables are allowed to change at the same time.

Figure 11:
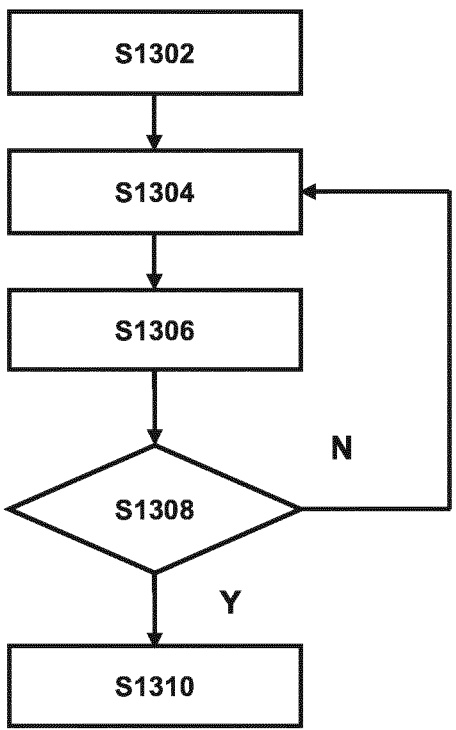
FIG. 11 shows an embodiment of another optimization method, according to an embodiment.

In FIG. 11, the optimization of all the design variables is executed simultaneously. Such flow may be called the simultaneous flow or co-optimization flow. Alternatively, the optimization of all the design variables is executed alternatively, as illustrated in FIG. 11. In this flow, in each step, some design variables are fixed while the other design variables are optimized to minimize the cost function; then in the next step, a different set of variables are fixed while the others are optimized to minimize the cost function. These steps are executed alternatively until convergence or certain terminating conditions are met.

As shown in the non-limiting example flowchart of FIG. 11, first, a design layout (step S1302) is obtained, then a step of source optimization is executed in step S1304, where all the design variables of the illumination source are optimized (SO) to minimize the cost function while all the other design variables are fixed. Then in the next step S1306, a mask optimization (MO) is performed, where all the design variables of the patterning device are optimized to minimize the cost function while all the other design variables are fixed. These two steps are executed alternatively, until certain terminating conditions are met in step S1308. Various termination conditions can be used, such as, the value of the cost function becomes equal to a threshold value, the value of the cost function crosses the threshold value, the value of the cost function reaches within a preset error limit, or a preset number of iteration is reached, etc. Note that SO-MO-Alternative-Optimization is used as an example for the alternative flow. The alternative flow can take many different forms, such as SO-LO-MO-Alternative-Optimization, where SO, LO (Lens Optimization) is executed, and MO alternatively and iteratively; or first SMO can be executed once, then execute LO and MO alternatively and iteratively;

and so on. Finally the output of the optimization result is obtained in step S1310, and the process stops.

The pattern selection algorithm, as discussed before, may be integrated with the simultaneous or alternative optimization. For example, when an alternative optimization is adopted, first a full-chip SO can be performed, the 'hot spots' and/or 'warm spots' are identified, then an MO is performed. In view of the present disclosure numerous permutations and combinations of sub-optimizations are possible in order to achieve the desired optimization results.

Figure 12A:
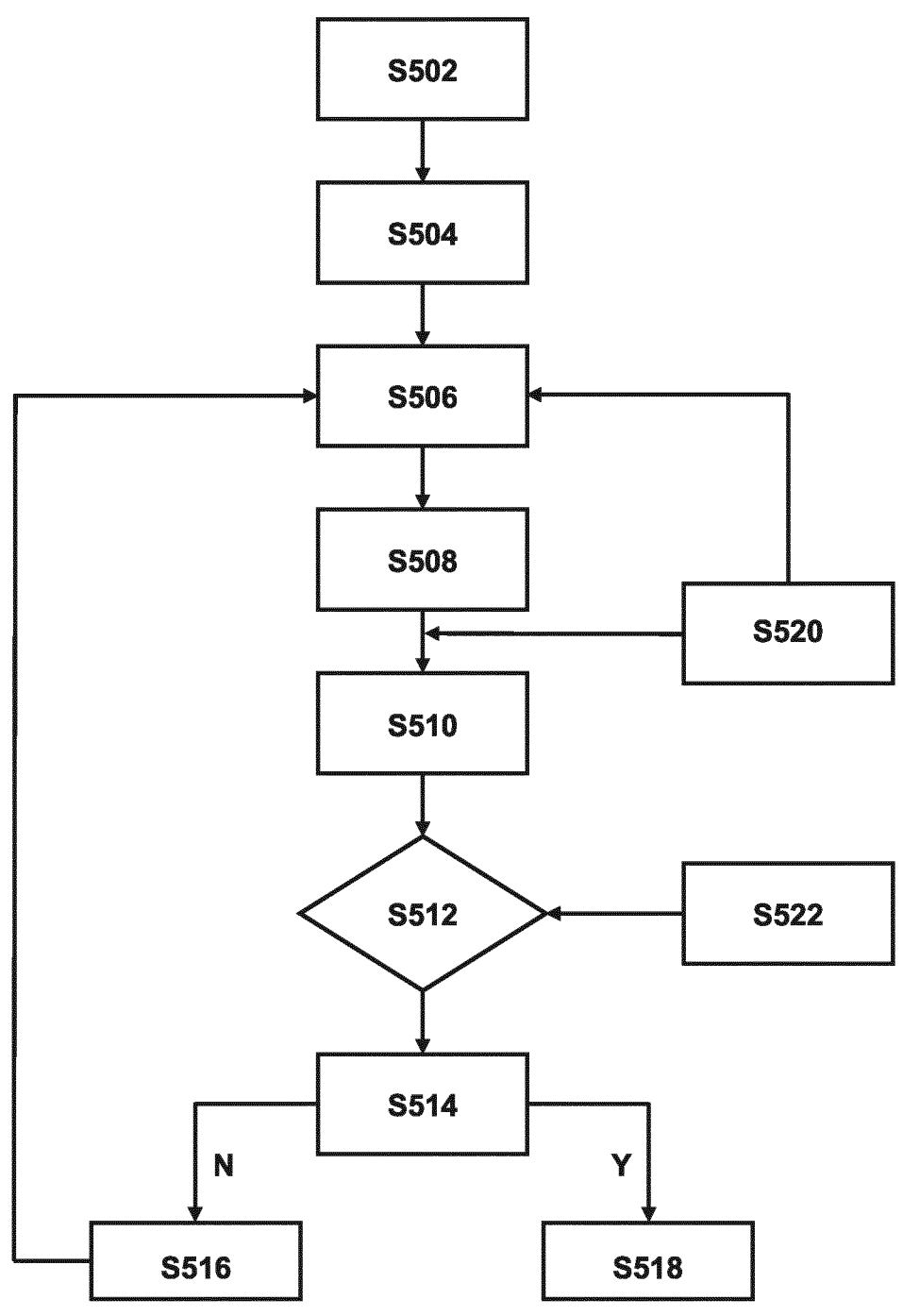
FIGS. 12A, 12B and 13 show example flowcharts of various optimization processes, according to an embodiment.

FIG. 12A shows one exemplary method of optimization, where a cost function is minimized. In step S502, initial values of design variables are obtained, including their tuning ranges, if any. In step S504, the multi-variable cost function is set up. In step S506, the cost function is expanded within a small enough neighborhood around the starting point value of the design variables for the first iterative step (i=0). In step S508, standard multi-variable optimization techniques are applied to minimize the cost function. Note that the optimization problem can apply constraints, such as tuning ranges, during the optimization process in S508 or at a later stage in the optimization process. Step S520 indicates that each iteration is done for the given test patterns (also known as "gauges") for the identified evaluation points that have been selected to optimize the lithographic process. In step S510, a lithographic response is predicted. In step S512, the result of step S510 is compared with a desired or ideal lithographic response value obtained in step S522. If the termination condition is satisfied in step S514, i.e. the optimization generates a lithographic response value sufficiently close to the desired value, and then the final value of the design variables is outputted in step S518. The output step may also include outputting other functions using the final values of the design variables, such as outputting a wavefront aberration-adjusted map at the pupil plane (or other planes), an optimized source map, and optimized design layout etc. If the termination condition is not satisfied, then in step S516, the values of the design variables is updated with the result of the i-th iteration, and the process goes back to step S506. The process of FIG. 12A is elaborated in details below.

In an exemplary optimization process, no relationship between the design variables $(z_1, z_2, \ldots, z_N)$ and $f_p(z_1, z_2, \ldots, z_N)$ is assumed or approximated, except that $f_p(z_1, z_2, \ldots, z_N)$ is sufficiently smooth (e.g. first order derivatives $$\frac{\partial f_p(z_1, z_2, \ldots, z_N)}{\partial z_n}, (n = 1,2, \ldots, N)$$

exist), which is generally valid in a lithographic projection apparatus. An algorithm, such as the Gauss-Newton algorithm, the Levenberg-Marquardt algorithm, the gradient descent algorithm, simulated annealing, the genetic algorithm, can be applied to find $(\tilde{z}_1, \tilde{z}_2, \ldots, \tilde{z}_N)$.

Here, the Gauss-Newton algorithm is used as an example. The Gauss-Newton algorithm is an iterative method applicable to a general non-linear multi-variable optimization problem. In the i-th iteration wherein the design variables $(z_1, z_2, \ldots, z_N)$ the take values of $(z_{1i}, z_{2i}, \ldots, z_{Ni})$, the Gauss-Newton algorithm linearizes $f_p(z_1, z_2, \ldots, z_N)$ in the vicinity of $(z_{1i}, z_{2i}, \ldots, z_{Ni})$ and then calculates values $(z_{1(i+1)}, z_{2(i+1)}, \ldots, z_{N(i+1)})$ in the vicinity of $(z_{1i}, z_{2i}, \ldots, z_{Ni})$ that give a minimum of CF $(z_1, z_2, \ldots, z_N)$. The design variables $(z_1, z_2, \ldots, z_N)$ take the values of $(z_{1(i+1)}, z_{2(i+1)}, \ldots, z_{N(i+1)})$ in the (i+1)-th iteration. This iteration continues until convergence (i.e. CF $(z_1, z_2, \ldots, z_N)$ does not reduce any further) or a preset number of iterations is reached.

Specifically, in the i-th iteration, in the vicinity of $(z_{1i}, z_{2i}, \ldots, z_{Ni})$, $$f_p(z_1, z_2, \ldots, z_N) \approx f_p(z_1, z_2, \ldots, z_N) + \qquad \text{(Eq. 3)}$$

$$\sum_{n=1}^{N} \left. \frac{\partial f_p(z_1, z_2, \ldots, z_N)}{\partial z_n} \right|_{z_1=z_{1i}, z_2=z_{2i}, \ldots, z_N=z_{Ni},} (z_n - z_{ni})$$

Under the approximation of Eq. 3, the cost function becomes:

$$CF(z_1, z_2, \ldots, z_N) = \sum_{p=1}^{P} w_p f_p^2(z_1, z_2, \ldots, z_N) = \sum_{p=1}^{P} w_p \left( f_p(z_1, z_2, \ldots, z_N) + \sum_{n=1}^{N} \left. \frac{\partial f_p(z_1, z_2, \ldots, z_N)}{\partial z_n} \right|_{z_1=z_{1i}, z_2=z_{2i}, \ldots, z_N=z_{Ni},} (z_n - z_{ni}) \right)^2 \qquad \text{(Eq. 4)}$$

which is a quadratic function of the design variables $(z_1, z_2, \ldots, z_N)$. Every term is constant except the design variables $(z_1, z_2, \ldots, z_N)$.

If the design variables $(z_1, z_2, \ldots, z_N)$ are not under any constraints, $(z_{1(i+1)}, z_{2(i+1)}, \ldots, z_{N(i+1)})$ can be derived by solving by N linear equations:

$$\frac{\partial CF(z_1, z_2, \ldots, z_N)}{\partial z_n} = 0,$$

wherein n=1, 2, . . . N.

If the design variables $(z_1, z_2, \ldots, z_N)$ are under the constraints in the form of J inequalities (e.g. tuning ranges of $$(z_1, z_2, \ldots, z_N)) \sum_{n-1}^{N} A_{nj} z_n \le B_j,$$

for j=1, 2, . . . J; and K equalities (e.g. interdependence between the design variables)

$$\sum_{n=1}^{N} C_{nk} z_n = D_k,$$

for k=1, 2, . . . K; the optimization process becomes a classic quadratic programming problem, wherein $A_{nj}$, $B_j$, $C_{nk}$, $D_k$ are constants. Additional constraints can be imposed for each iteration. For example, a "damping factor" $\Delta_D$ can be introduced to limit the difference between $(z_{1(i+1)},$ $z_{2(i+1)}, \ldots, z_{N(i+1)})$ and $(z_{1i}, z_{2i}, \ldots, z_{Ni})$, so that the approximation of Eq. 3 holds. Such constraints can be expressed as $z_{ni} - \Delta_D \le z_n \le z_{ni} + \Delta_D$. $(z_{1(i+1)}, z_{2(i+1)}, \ldots, z_{N(i+1)})$ can be derived using, for example, methods described in Numerical Optimization ($2^{nd}$ ed.) by Jorge Nocedal and Stephen J. Wright (Berlin New York: Vandenberghe. Cambridge University Press).

Instead of minimizing the RMS of $f_p(z_1, z_2, \ldots, z_N)$, the optimization process can minimize magnitude of the largest deviation (the worst defect) among the evaluation points to their intended values. In this approach, the cost function can alternatively be expressed as $$CF(z_1, z_2, \ldots, z_N) = \max_{1 \le p \le P} \frac{f_p(z_1, z_2, \ldots, z_N)}{CL_p}, \qquad \text{(Eq. 5)}$$

wherein $CL_p$ is the maximum allowed value for $f_p(z_1, z_2, \ldots, z_N)$. This cost function represents the worst defect among the evaluation points. Optimization using this cost function minimizes magnitude of the worst defect. An iterative greedy algorithm can be used for this optimization.

The cost function of Eq. 5 can be approximated as:

$$CF(z_1, z_2, \ldots, z_N) = \sum_{p=1}^{P} \left( \frac{f_p(z_1, z_2, \ldots, z_N)}{CL_p} \right)^q, \qquad \text{(Eq. 6)}$$

wherein q is an even positive integer such as at least 4, preferably at least 10. Eq 6 mimics the behavior of Eq. 5, while allowing the optimization to be executed analytically and accelerated by using methods such as the deepest descent method, the conjugate gradient method, etc.

Minimizing the worst defect size can also be combined with linearizing of $f_p(z_1, z_2, \ldots, z_N)$. Specifically, $f_p(z_1, z_2, \ldots, z_N)$ is approximated as in Eq. 3. Then the constraints on worst defect size are written as inequalities $E_{Lp} \le f_p(z_1, z_2, \ldots, z_N) \le E_{Up}$, wherein $E_{Lp}$ and $E_{Up}$ are two constants specifying the minimum and maximum allowed deviation for the $f_p(z_1, z_2, \ldots, z_N)$. Plugging Eq. 3 in, these constraints are transformed to, for p=1, . . . P, $$\sum_{n=1}^{N} \left. \frac{\partial f_p(z_1, z_2, \ldots, z_N)}{\partial z_n} \right|_{z_1=z_{1i}, z_2=z_{2i}, \ldots, z_N=z_{Ni},} z_n \le E_{Up} + \sum_{n=1}^{N} \left. \frac{\partial f_p(z_1, z_2, \ldots, z_N)}{\partial z_n} \right|_{z_1=z_{1i}, z_2=z_{2i}, \ldots, z_N=z_{Ni},} z_{ni} - f_p(z_{1i}, z_{2i}, \ldots, z_{Ni}) \text{ And} \qquad \text{(Eq. 6')}$$

$$-\sum_{n=1}^{N} \left. \frac{\partial f_p(z_1, z_2, \ldots, z_N)}{\partial z_n} \right|_{z_1=z_{1i}, z_2=z_{2i}, \ldots, z_N=z_{Ni},} z_n \le -E_{Up} - \sum_{n=1}^{N} \left. \frac{\partial f_p(z_1, z_2, \ldots, z_N)}{\partial z_n} \right|_{z_1=z_{1i}, z_2=z_{2i}, \ldots, z_N=z_{Ni},} z_{ni} + f_p(z_{1i}, z_{2i}, \ldots, z_{Ni}) \qquad \text{(Eq. 6'')}$$

Since Eq. 3 is generally valid only in the vicinity of $(z_{1i}, z_{2i}, \ldots, z_{Ni})$ in case the desired constraints $E_{Lp} \le f_p(z_1, z_2, \ldots, z_N) \le E_{Up}$ cannot be achieved in such vicinity, which can be determined by any conflict among the inequalities, the constants $E_{Lp}$ and $E_{Up}$ can be relaxed until the constraints are achievable. This optimization process minimizes the worst defect size in the vicinity of $(z_{1i}, z_{2i}, \ldots, z_{Ni})$. Then each step reduces the worst defect size gradually, and each step is executed iteratively until certain terminating conditions are met. This will lead to optimal reduction of the worst defect size.

Another way to minimize the worst defect is to adjust the weight $w_p$ in each iteration. For example, after the i-th iteration, if the r-th evaluation point is the worst defect, $w_r$ can be increased in the (i+1)-th iteration so that the reduction of that evaluation point's defect size is given higher priority.

In addition, the cost functions in Eq. 4 and Eq. 5 can be modified by introducing a Lagrange multiplier to achieve compromise between the optimization on RMS of the defect size and the optimization on the worst defect size, i.e., $$CF(z_1, z_2, \ldots, z_N) = \sum_{p=1}^{P} w_p f_p^2(z_1, z_2, \ldots, z_N) = \max_{1 \le p \le P} \frac{f_p(z_1, z_2, \ldots, z_N)}{CL_p} \tag{Eq. 6'''}$$

where $\lambda$ is a preset constant that specifies the trade-off between the optimization on RMS of the defect size and the optimization on the worst defect size. In particular, if $\lambda=0$, then this becomes Eq. 4 and the RMS of the defect size is only minimized; while if $\lambda=1$, then this becomes Eq. 5 and the worst defect size is only minimized; if $0<\lambda<1$, then both are taken into consideration in the optimization. Such optimization can be solved using multiple methods. For example, the weighting in each iteration may be adjusted, similar to the one described previously. Alternatively, similar to minimizing the worst defect size from inequalities, the inequalities of Eq. 6' and 6" can be viewed as constraints of the design variables during solution of the quadratic programming problem. Then, the bounds on the worst defect size can be relaxed incrementally or increase the weight for the worst defect size incrementally, compute the cost function value for every achievable worst defect size, and choose the design variable values that minimize the total cost function as the initial point for the next step. By doing this iteratively, the minimization of this new cost function can be achieved.

Optimizing a lithographic projection apparatus can expand the process window. A larger process window provides more flexibility in process design and chip design. The process window can be defined as a set of focus and dose values for which the resist image are within a certain limit of the design target of the resist image. Note that all the methods discussed here may also be extended to a generalized process window definition that can be established by different or additional base parameters in addition to exposure dose and defocus. These may include, but are not limited to, optical settings such as NA, sigma, aberrations, polarization, or optical constants of the resist layer. For example, as described earlier, if the PW also consists of different mask bias, then the optimization includes the minimization of MEEF (Mask Error Enhancement Factor), which is defined as the ratio between the substrate EPE and the induced mask edge bias. The process window defined on focus and dose values only serve as an example in this disclosure. A method of maximizing the process window, according to an embodiment, is described below.

In a first step, starting from a known condition $(f_0, \varepsilon_0)$ in the process window, wherein $f_0$ is a nominal focus and $\varepsilon_0$ is a nominal dose, minimizing one of the cost functions below in the vicinity $(f_0 \pm \Delta f, \varepsilon_0 \pm \Delta \varepsilon)$:

$$CF(z_1, z_2, \ldots, z_N) = \tag{Eq. 7}$$
$$\sum_{p=1}^{P} w_p f_p^2(z_1, z_2, \ldots, z_N) = \max_{1 \le p \le P} \frac{f_p(z_1, z_2, \ldots, z_N)}{CL_p}, \text{ or}$$

$$CF(z_1, z_2, \ldots, z_N, f_0, \varepsilon_0) = \tag{Eq. 7'}$$
$$\sum_{(f,\varepsilon)=(f_0 \pm \Delta f, \varepsilon_0 \pm \Delta \varepsilon)} \sum_p w_p f_p^2(z_1, z_2, \ldots, z_N, f, \varepsilon) \text{ or}$$

$$CF(z_1, z_2, \ldots, z_N, f_0, \varepsilon_0) = \tag{Eq. 7''}$$
$$(1-\lambda) \sum_{(f,\varepsilon)=(f_0 \pm \Delta f, \varepsilon_0 \pm \Delta \varepsilon)} \sum_p w_p f_p^2(z_1, z_2, \ldots, z_N, f, \varepsilon) +$$
$$\lambda \max_{(f,\varepsilon)=(f_0 \pm \Delta f, \varepsilon_0 \pm \Delta \varepsilon)} + \max_p |f_p(z_1, z_2, \ldots, z_N, f, \varepsilon)|$$

If the nominal focus $f_0$ and nominal dose $\varepsilon_0$ are allowed to shift, they can be optimized jointly with the design variables $(z_1, z_2, \ldots, z_N)$. In the next step, $(f_0 \pm \Delta f, \varepsilon_0 \pm \Delta \varepsilon)$ is accepted as part of the process window, if a set of values of $(z_1, z_2, \ldots, z_N, f, \varepsilon)$ can be found such that the cost function is within a preset limit.

Alternatively, if the focus and dose are not allowed to shift, the design variables $(z_1, z_2, \ldots, z_N)$ are optimized with the focus and dose fixed at the nominal focus $f_0$ and nominal dose $\varepsilon_0$. In an alternative embodiment, $(f_0 \pm \Delta f, \varepsilon_0 \pm \Delta \varepsilon)$ is accepted as part of the process window, if a set of values of $(z_1, z_2, \ldots, z_N)$ can be found such that the cost function is within a preset limit.

The methods described earlier in this disclosure can be used to minimize the respective cost functions of Eqs. 7, 7', or 7". If the design variables are characteristics of the projection optics, such as the Zernike coefficients, then minimizing the cost functions of Eqs. 7, 7', or 7" leads to process window maximization based on projection optics optimization, i.e., LO. If the design variables are characteristics of the source and patterning device in addition to those of the projection optics, then minimizing the cost function of Eqs. 7, 7', or 7" leads to process window maximizing based on SMLO, as illustrated in FIG. 11. If the design variables are characteristics of the source and patterning device and, then minimizing the cost functions of Eqs. 7, 7', or 7" leads to process window maximization based on SMO. The cost functions of Eqs. 7, 7', or 7" can also include at least one $f_p(z_1, z_2, \ldots, z_N)$ such as that in Eq. 7 or Eq. 8, that is a function of one or more stochastic effects such as the LWR or local CD variation of 2D features, and throughput.

Figure 13:
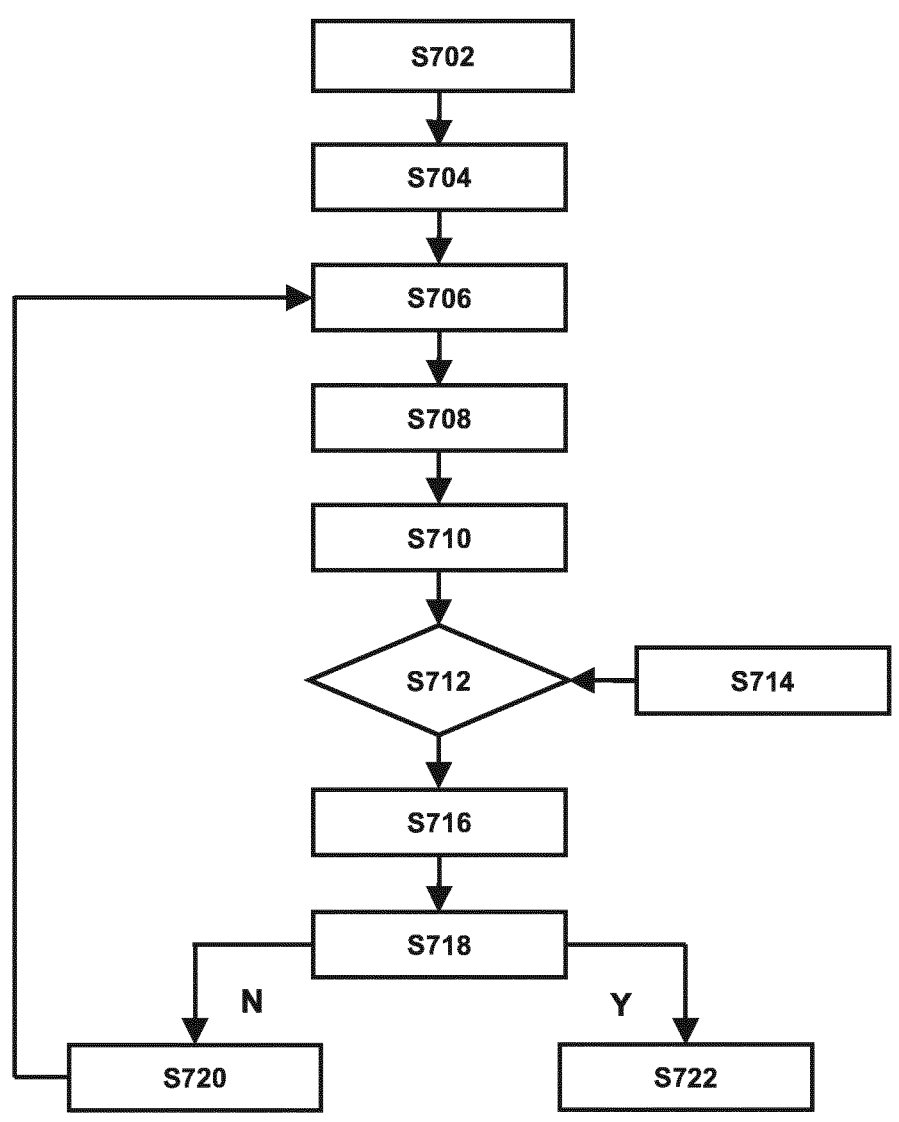

FIG. 13 shows one specific example of how a simultaneous SMLO process can use a Gauss Newton Algorithm for optimization. In step S702, starting values of design variables are identified. Tuning ranges for each variable may also be identified. In step S704, the cost function is defined using the design variables. In step S706 cost function is expanded around the starting values for all evaluation points in the design layout. In optional step S710, a full-chip simulation is executed to cover all critical patterns in a full-chip design layout. Desired lithographic response metric (such as CD or EPE) is obtained in step S714, and compared with predicted values of those quantities in step S712. In step S716, a process window is determined. Steps S718, S720, and S722 are similar to corresponding steps S514, S516 and S518, as described with respect to FIG. 12A. As mentioned before, the final output may be a wavefront aberration map in the pupil plane, optimized to produce the desired imaging performance. The final output may also be an optimized source map and/or an optimized design layout.

Figure 12B:
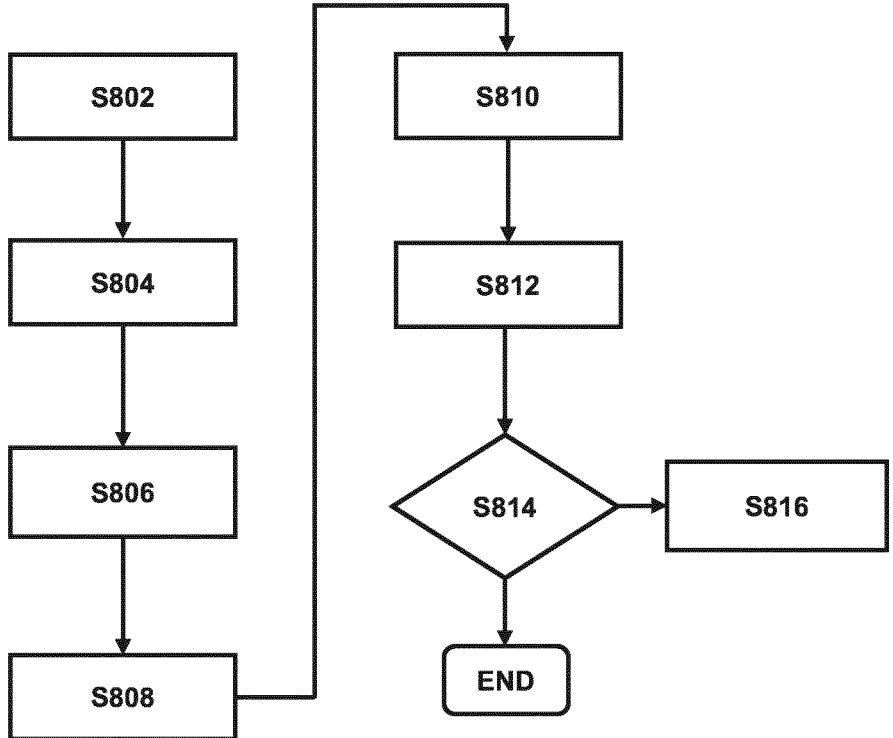

FIG. 12B shows an exemplary method to optimize the cost function where the design variables $(z_1, z_2, \ldots, z_N)$ include design variables that may only assume discrete values.

The method starts by defining the pixel groups of the illumination source and the patterning device tiles of the patterning device (step S802). Generally, a pixel group or a patterning device tile may also be referred to as a division of a lithographic process component. In one exemplary approach, the illumination source is divided into 117 pixel groups, and 94 patterning device tiles are defined for the patterning device, substantially as described above, resulting in a total of 211 divisions.

In step S804, a lithographic model is selected as the basis for photolithographic simulation. Photolithographic simulations produce results that are used in calculations of photolithographic metrics, or responses. A particular photolithographic metric is defined to be the performance metric that is to be optimized (step S806). In step S808, the initial (pre-optimization) conditions for the illumination source and the patterning device are set up. Initial conditions include initial states for the pixel groups of the illumination source and the patterning device tiles of the patterning device such that references may be made to an initial illumination shape and an initial patterning device pattern. Initial conditions may also include mask bias, NA, and focus ramp range. Although steps S802, S804, S806, and S808 are depicted as sequential steps, it will be appreciated that in other embodiments of the invention, these steps may be performed in other sequences.

In step S810, the pixel groups and patterning device tiles are ranked. Pixel groups and patterning device tiles may be interleaved in the ranking. Various ways of ranking may be employed, including: sequentially (e.g., from pixel group 1 to pixel group 117 and from patterning device tile 1 to patterning device tile 94), randomly, according to the physical locations of the pixel groups and patterning device tiles (e.g., ranking pixel groups closer to the center of the illumination source higher), and according to how an alteration of the pixel group or patterning device tile affects the performance metric.

Once the pixel groups and patterning device tiles are ranked, the illumination source and patterning device are adjusted to improve the performance metric (step S812). In step S812, each of the pixel groups and patterning device tiles are analyzed, in order of ranking, to determine whether an alteration of the pixel group or patterning device tile will result in an improved performance metric. If it is determined that the performance metric will be improved, then the pixel group or patterning device tile is accordingly altered, and the resulting improved performance metric and modified illumination shape or modified patterning device pattern form the baseline for comparison for subsequent analyses of lower-ranked pixel groups and patterning device tiles. In other words, alterations that improve the performance metric are retained. As alterations to the states of pixel groups and patterning device tiles are made and retained, the initial illumination shape and initial patterning device pattern changes accordingly, so that a modified illumination shape and a modified patterning device pattern result from the optimization process in step S812.

In other approaches, patterning device polygon shape adjustments and pairwise polling of pixel groups and/or patterning device tiles are also performed within the optimization process of S812.

In an alternative embodiment the interleaved simultaneous optimization procedure may include to alter a pixel group of the illumination source and if an improvement of the performance metric is found, the dose is stepped up and down to look for further improvement. In a further alternative embodiment the stepping up and down of the dose or intensity may be replaced by a bias change of the patterning device pattern to look for further improvement in the simultaneous optimization procedure.

In step S814, a determination is made as to whether the performance metric has converged. The performance metric may be considered to have converged, for example, if little or no improvement to the performance metric has been witnessed in the last several iterations of steps S810 and S812. If the performance metric has not converged, then the steps of S810 and S812 are repeated in the next iteration, where the modified illumination shape and modified patterning device from the current iteration are used as the initial illumination shape and initial patterning device for the next iteration (step S816).

The optimization methods described above may be used to increase the throughput of the lithographic projection apparatus. For example, the cost function may include an $f_p(z_1, z_2, \ldots, z_N)$ that is a function of the exposure time. Optimization of such a cost function is preferably constrained or influenced by a measure of the stochastic effects or other metrics. Specifically, a computer-implemented method for increasing a throughput of a lithographic process may include optimizing a cost function that is a function of one or more stochastic effects of the lithographic process and a function of an exposure time of the substrate, in order to minimize the exposure time.

In one embodiment, the cost function includes at least one $f_p(z_1, z_2, \ldots, z_N)$ that is a function of one or more stochastic effects. The stochastic effects may include the failure of a feature, measurement data (e.g., SEPE) determined as in method of FIG. 3, LWR or local CD variation of 2D features. In one embodiment, the stochastic effects include stochastic variations of characteristics of a resist image. For example, such stochastic variations may include failure rate of a feature, line edge roughness (LER), line width roughness (LWR) and critical dimension uniformity (CDU). Including stochastic variations in the cost function allows finding values of design variables that minimize the stochastic variations, thereby reducing risk of defects due to stochastic effects.

FIG. 14 is a block diagram that illustrates a computer system 100 which can assist in implementing the optimization methods and flows disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of the optimization process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions.

The instructions received by main memory 106 may optionally be stored on storage device 110 either before or after execution by processor 104.

Computer system 100 also preferably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. One such downloaded application may provide for the illumination optimization of the embodiment, for example. The received code may be executed by processor 104 as it is received, and/or stored in storage device 110, or other non-volatile storage for later execution. In this manner, computer system 100 may obtain application code in the form of a carrier wave.

Figure 15:
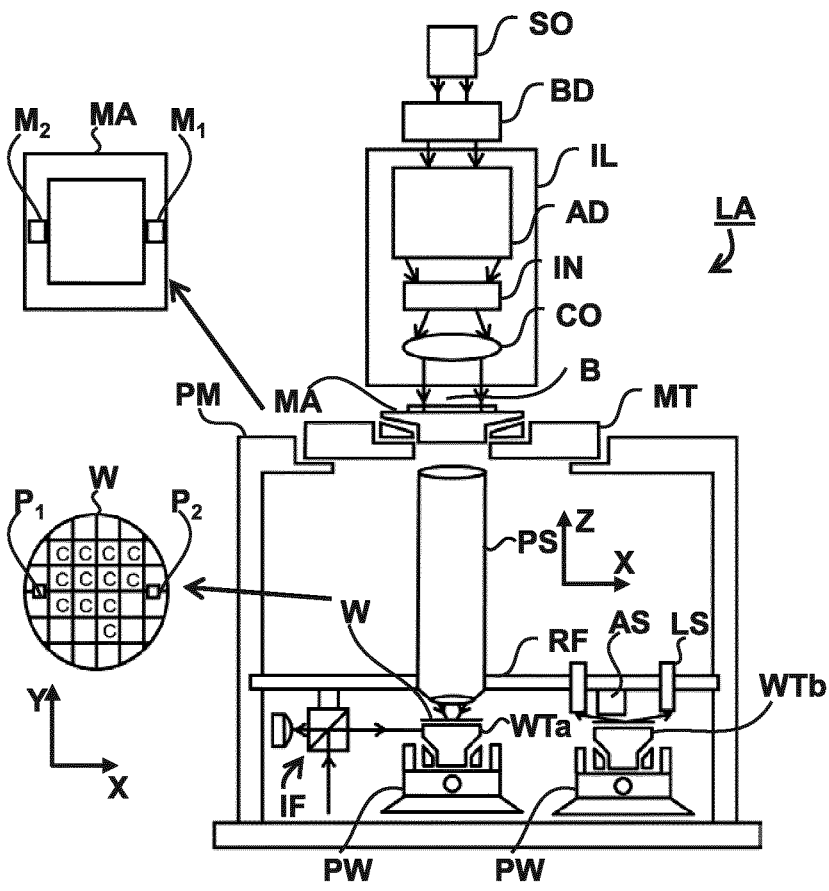
FIG. 15 is a schematic diagram of a lithographic projection apparatus, according to an embodiment.

FIG. 15 schematically depicts an exemplary lithographic projection apparatus whose illumination source could be optimized utilizing the methods described herein. The apparatus comprises:

an illumination system IL, to condition a beam B of radiation. In this particular case, the illumination system also comprises a radiation source SO;

a first object table (e.g., mask table) MT provided with a patterning device holder to hold a patterning device MA (e.g., a reticle), and connected to a first positioner to accurately position the patterning device with respect to item PS;

a second object table (substrate table) WT provided with a substrate holder to hold a substrate W (e.g., a resist-coated silicon wafer), and connected to a second positioner to accurately position the substrate with respect to item PS;

a projection system ("lens") PS (e.g., a refractive, catoptric or catadioptric optical system) to image an irradiated portion of the patterning device MA onto a target portion C (e.g., comprising one or more dies) of the substrate W.

As depicted herein, the apparatus is of a transmissive type (i.e., has a transmissive mask). However, in general, it may also be of a reflective type, for example (with a reflective mask). Alternatively, the apparatus may employ another kind of patterning device as an alternative to the use of a classic mask; examples include a programmable mirror array or LCD matrix.

The source SO (e.g., a mercury lamp or excimer laser) produces a beam of radiation. This beam is fed into an illumination system (illuminator) IL, either directly or after having traversed conditioning means, such as a beam expander Ex, for example. The illuminator IL may comprise adjusting means AD for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam B impinging on the patterning device MA has a desired uniformity and intensity distribution in its cross-section.

It should be noted with regard to FIG. 15 that the source SO may be within the housing of the lithographic projection apparatus (as is often the case when the source SO is a mercury lamp, for example), but that it may also be remote from the lithographic projection apparatus, the radiation beam that it produces being led into the apparatus (e.g., with the aid of suitable directing mirrors); this latter scenario is often the case when the source SO is an excimer laser (e.g., based on KrF, ArF or $F_2$ lasing).

The beam PB subsequently intercepts the patterning device MA, which is held on a patterning device table MT. Having traversed the patterning device MA, the beam B passes through the lens PL, which focuses the beam B onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the patterning device MA with respect to the path of the beam B, e.g., after mechanical retrieval of the patterning device MA from a patterning device library, or during a scan. In general, movement of the object tables MT, WT will be realized with the aid of a long-stroke module (coarse positioning) and a short-stroke module (fine positioning), which are not explicitly depicted in FIG. 15. However, in the case of a wafer stepper (as opposed to a step-and-scan tool) the patterning device table MT may just be connected to a short stroke actuator, or may be fixed.

The depicted tool can be used in two different modes:

In step mode, the patterning device table MT is kept essentially stationary, and an entire patterning device image is projected in one go (i.e., a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the patterning device table MT is movable in a given direction (the so-called "scan direction", e.g., the y direction) with a speed v, so that the projection beam B is caused to scan over a patterning device image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 16:
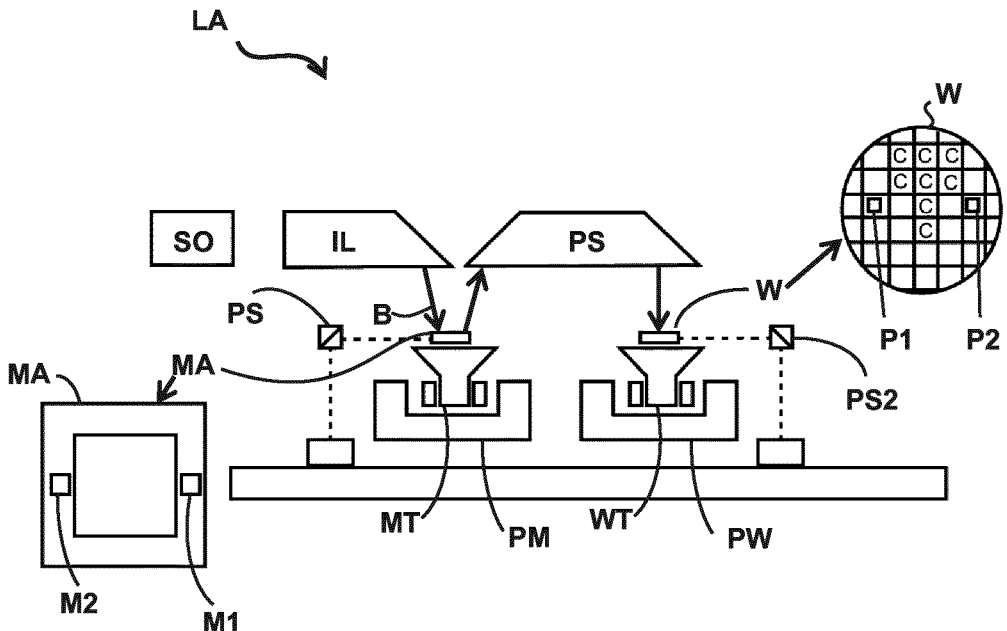
FIG. 16 is a schematic diagram of another lithographic projection apparatus, according to an embodiment.

FIG. 16 schematically depicts another exemplary lithographic projection apparatus 1000 whose illumination source could be optimized utilizing the methods described herein.

The lithographic projection apparatus 1000 includes:

a source collector module SO an illumination system (illuminator) IL configured to condition a radiation beam B (e.g. EUV radiation).

a support structure (e.g. a mask table) MT constructed to support a patterning device (e.g. a mask or a reticle) MA and connected to a first positioner PM configured to accurately position the patterning device;

a substrate table (e.g. a wafer table) WT constructed to hold a substrate (e.g. a resist coated wafer) W and connected to a second positioner PW configured to accurately position the substrate; and a projection system (e.g. a reflective projection system) PS configured to project a pattern imparted to the radiation beam B by patterning device MA onto a target portion C (e.g. comprising one or more dies) of the substrate W.

As here depicted, the apparatus 1000 is of a reflective type (e.g. employing a reflective mask). It is to be noted that because most materials are absorptive within the EUV wavelength range, the mask may have multilayer reflectors comprising, for example, a multi-stack of Molybdenum and Silicon. In one example, the multi-stack reflector has a 40 layer pairs of Molybdenum and Silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Referring to FIG. 16, the illuminator IL receives an extreme ultra violet radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. The source collector module SO may be part of an EUV radiation system including a laser, not shown in FIG. 16, for providing the laser beam exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus 1000 could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 17:
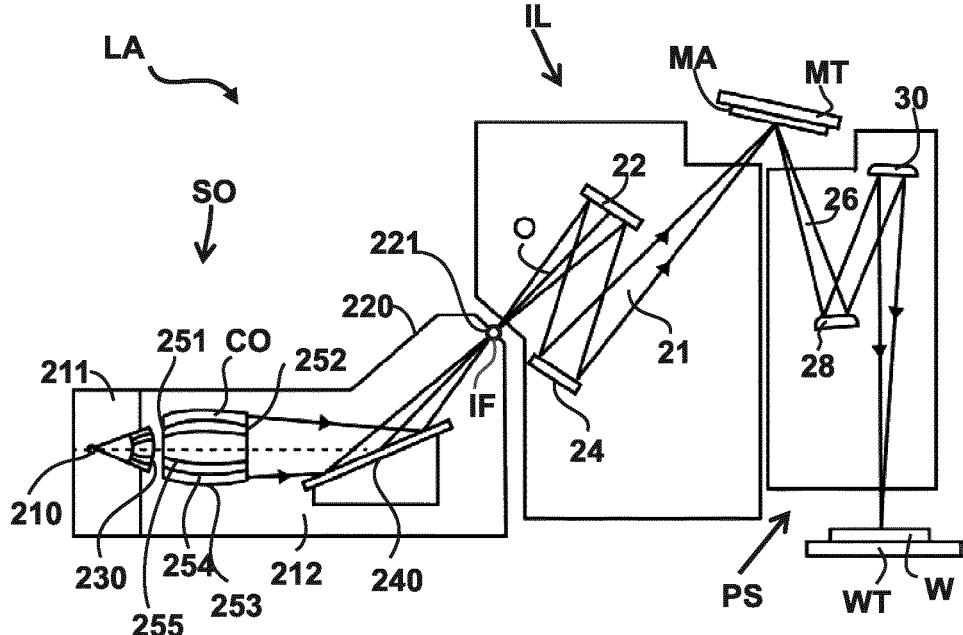
FIG. 17 is a more detailed view of the apparatus in FIG. 16, according to an embodiment.

FIG. 17 shows the apparatus 1000 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line 'O'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination optics unit IL and projection system PS. The grating spectral filter 240 may optionally be present, depending upon the type of lithographic apparatus. Further, there may be more mirrors present than those shown in the figures, for example there may be 1-6 additional reflective elements present in the projection system PS than shown in FIG. 17.

Collector optic CO, as illustrated in FIG. 17, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type is preferably used in combination with a discharge produced plasma source, often called a DPP source.

Figure 18:
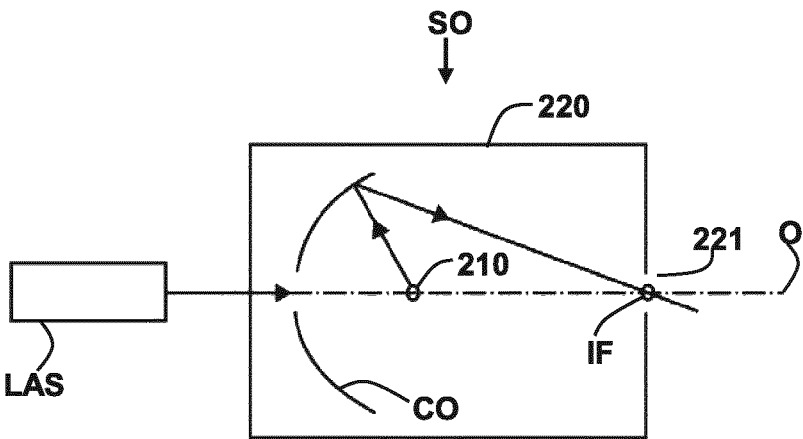
FIG. 18 is a more detailed view of the source collector module SO of the apparatus of FIGS. 16 and 17, according to an embodiment.

Alternatively, the source collector module SO may be part of an LPP radiation system as shown in FIG. 18. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

The embodiments may further be described using the following clauses:

1. A method for determining a mask pattern to be employed in a patterning process, the method comprising:

obtaining, via executing a model using a target pattern to be printed on a substrate as an input pattern, a post optical proximity correction (post-OPC) pattern;

determining, based on the post-OPC pattern, a simulated pattern that will be printed on the substrate; and determining the mask pattern based on a difference between the simulated pattern and the target pattern, the determining of the mask pattern comprises:

modifying, based on the difference, the input pattern inputted to the model such that the difference is reduced; and executing, using the modified input pattern, the model to generate a modified post-OPC pattern from which the mask pattern can be derived.

2. The method of clause 1, wherein the model is a trained machine learning model configured to generate a post-OPC pattern for an input pattern.

3. The method of clause 2, wherein the determining of the mask pattern is an iterative process, each iteration comprises:

modifying, based on a gradient of the difference, at least a portion of the input pattern to reduce the difference between the target pattern and the simulated pattern, the gradient being indicative of how the target pattern be modified to reduce or minimize the difference;

executing, using the modified input pattern, the trained machine learning model to generate the modified post-OPC pattern;

determining the simulated pattern based on the modified post-OPC pattern;

determining whether the difference between the simulated pattern and the target pattern is reduced or minimized; and responsive to the difference being reduced or minimized, extracting polygon shapes from the modified post-OPC pattern to generate the mask pattern.

4. The method of clause 3, wherein the at least a portion of the input pattern comprises a contour corresponding to a target feature within the target pattern.

5. The method of clause 4, wherein the determining of the difference the simulated pattern and the target pattern comprises:

determining the difference between a target contour of the target pattern and a simulated contour of the simulated pattern.

6. The method of clause 5, wherein the modifying of the input pattern comprises:

modifying, based on the gradient of the difference, the contour of the input pattern to reduce the difference between the target contour and the simulated contour, the gradient being indicative of how the contour of the input pattern be modified to reduce or minimize the difference.

7. The method of clause 6, wherein the modifying of the input pattern comprises:

assigning control points on the target contour; and adjusting, based on the gradient of the difference, a position of one or more control point such that the difference is reduced or minimized.

8. The method of clause 7, wherein the gradient is a differential of the difference with respect to the control points, the gradient indicating a change in the difference due a change in a position of a control point.

9. The method of any of clauses 1-8, wherein the determining of the simulated pattern comprises:

executing a process model of the patterning process using the post-OPC pattern or the modified post-OPC pattern to generate a simulated pattern.

10. The method of any of clauses 1-9, wherein the extracting of the polygon shapes from the modified post-OPC pattern comprises:

processing, via thresholding, an image of the modified post-OPC pattern to detect edges associated with one or more features within the modified post-OPC pattern; and generating the mask pattern using the edges of the one or more features.

11. The method of any of clauses 1-10, wherein the post-OPC pattern or the modified post-OPC pattern comprises: a main feature corresponding to the target feature, and optionally at least one assist feature located around the main feature.

12. The method of clause 11, wherein the at least one assist feature is not modified in a second or a subsequent execution of the trained machine learning model when the modified input pattern is used.

13. The method of any of clauses 11-12, wherein the extracted polygons include polygons associated with the main feature and optionally the at least one assist feature.

14. The method of any of clauses 1-13, wherein the target pattern, the post-OPC pattern, and/or the modified post-OPC pattern is a gray-scale pixelated image.

15. The method of any of clauses 9-14, wherein the process model is an after development process model, and the simulated pattern is an after development image.

16. The method of clause 15, wherein the process model is a resist model and the simulated pattern is a resist pattern.

17. A method of training a machine learning model associated with a patterning process, the method comprising:

obtaining a training data set comprising: (i) a set of perturbed target patterns associated with a target pattern to be printed on a substrate, and (ii) a set of reference patterns, each reference pattern being associated with a particular perturbed target pattern of the set of perturbed target pattern; and training, via a hardware computer system using the training data set, the machine learning model to generate a post-OPC pattern such that the model-generated post-OPC pattern tailored to match a particular reference pattern of the set of reference patterns.

18. The method of clause 17, wherein the obtaining of the training data set comprises:

generating, via executing an OPC process using the target pattern as an input, a reference pattern, the reference pattern being a post-OPC pattern comprising a main feature corresponding to a target feature of the target pattern;

perturbing at least a portion of the target pattern to generate a plurality of perturbed target patterns; and generating, via executing the OPC process using the plurality of perturbed target patterns as the input, a plurality of reference patterns.

19. The method of clause 17, wherein the training of the machine learning model is an iterative process, each iteration comprises:

executing, using a perturbed target pattern of the set of perturbed patterns as the input, the machine learning model to generate a post-OPC pattern;

determining a difference between the model-generated post-OPC pattern and a reference pattern of the set of reference patterns associated with the perturbed target pattern; and modifying, based on the difference, a parameter of the machine learning model so that the difference is reduced or minimized.

20. The method of clause 19, wherein the machine learning model is a convolutional neural network (CNN), and the parameter is one or more weights of the CNN.

21. The method of any of clauses 17-20, wherein the match between the model-generated post-OPC pattern and the particular reference pattern is identical.

22. The method of any of clauses 17-21, wherein each reference pattern is a post-OPC pattern including a same assist feature.

23. The method of clause 22, wherein the obtaining of the training data set further comprises:

extracting at least one assist feature from the reference pattern; and generating, via executing the OPC process using the plurality of perturbed target patterns as the input and keeping the extracted assist feature fixed, the plurality of reference patterns, wherein each reference pattern of the plurality of reference patterns has the extracted assist feature.

24. A non-transitory computer-readable medium comprising instructions that, when executed by one or more processors, cause operations comprising:

obtaining, via executing a model using a target pattern to be printed on a substrate as an input pattern, a post optical proximity correction (post-OPC) pattern;

determining, based on the post-OPC pattern, a simulated pattern that will be printed on the substrate; and determining a mask pattern based on a difference between the simulated pattern and the target pattern by:

modifying, based on the difference, the input pattern inputted to the model such that the difference is reduced; and executing, using the modified input pattern, the model to generate a modified post-OPC pattern from which the mask pattern can be derived.

25. The non-transitory computer readable medium of clause 24, wherein the model is a trained machine learning model configured to generate a post-OPC pattern for an input pattern.

26. The non-transitory computer readable medium of clause 25, wherein the determining of the mask pattern is an iterative process, each iteration comprises:

modifying, based on a gradient of the difference, at least a portion of the input pattern to reduce the difference between the target pattern and the simulated pattern, the gradient being indicative of how the target pattern be modified to reduce or minimize the difference;

executing, using the modified input pattern, the trained machine learning model to generate the modified post-OPC pattern;

determining the simulated pattern based on the modified post-OPC pattern;

determining whether the difference between the simulated pattern and the target pattern is reduced or minimized; and responsive to the difference being reduced or minimized, extracting polygon shapes from the modified post-OPC pattern to generate the mask pattern.

27. The non-transitory computer readable medium of clause 26, wherein the at least a portion of the input pattern comprises a contour corresponding to a target feature within the target pattern.

28. The non-transitory computer readable medium of clause 27, wherein the determining of the difference the simulated pattern and the target pattern comprises:

determining the difference between a target contour of the target pattern and a simulated contour of the simulated pattern.

29. The non-transitory computer readable medium of clause 28, wherein the modifying of the input pattern comprises:

modifying, based on the gradient of the difference, the contour of the input pattern to reduce the difference between the target contour and the simulated contour, the gradient being indicative of how the contour of the input pattern be modified to reduce or minimize the difference.

30. The non-transitory computer readable medium of clause 29, wherein the modifying of the input pattern comprises:

assigning control points on the target contour; and adjusting, based on the gradient of the difference, a position of one or more control point such that the difference is reduced or minimized.

31. The non-transitory computer readable medium of clause 30, wherein the gradient is a differential of the difference with respect to the control points, the gradient indicating a change in the difference due a change in a position of a control point.

32. The non-transitory computer readable medium of any of clauses 24-31, wherein the determining of the simulated pattern comprises:

executing a process model of the patterning process using the post-OPC pattern or the modified post-OPC pattern to generate a simulated pattern.

33. The non-transitory computer readable medium of any of clauses 24-32, wherein the extracting of the polygon shapes from the modified post-OPC pattern comprises:

processing, via thresholding, an image of the modified post-OPC pattern to detect edges associated with one or more features within the modified post-OPC pattern; and generating the mask pattern using the edges of the one or more features.

34. The non-transitory computer readable medium of any of clauses 24-33, wherein the post-OPC pattern or the modified post-OPC pattern comprises: a main feature corresponding to the target feature, and optionally at least one assist feature located around the main feature.

35. The non-transitory computer readable medium of clause 34, wherein the at least one assist feature is not modified in a second or a subsequent execution of the trained machine learning model when the modified input pattern is used.

36. The non-transitory computer readable medium of any of clauses 34-35, wherein the extracted polygons include polygons associated with the main feature and optionally the at least one assist feature.

37. The non-transitory computer readable medium of any of clauses 24-36, wherein the target pattern, the post-OPC pattern, and/or the modified post-OPC pattern is a gray-scale pixelated image.

38. The non-transitory computer readable medium of any of clauses 32-37, wherein the process model is an after development process model, and the simulated pattern is an after development image.

39. The non-transitory computer readable medium of clause 38, wherein the process model is a resist model and the simulated pattern is a resist pattern.

40. A non-transitory computer-readable medium comprising instructions that, when executed by one or more processors, cause operations comprising:

obtaining a training data set comprising: (i) a set of perturbed target patterns associated with a target pattern to be printed on a substrate, and (ii) a set of reference patterns, each reference pattern being associated with a particular perturbed target pattern of the set of perturbed target pattern; and training, using the training data set, the machine learning model to generate a post-OPC pattern such that the model-generated post-OPC pattern tailored to match a particular reference pattern of the set of reference patterns.

41. The non-transitory computer readable medium of clause 40, wherein the obtaining of the training data set comprises:

generating, via executing an OPC process using the target pattern as an input, a reference pattern, the reference pattern being a post-OPC pattern comprising a main feature corresponding to a target feature of the target pattern;

perturbing at least a portion of the target pattern to generate a plurality of perturbed target patterns; and generating, via executing the OPC process using the plurality of perturbed target patterns as the input, a plurality of reference patterns.

42. The non-transitory computer readable medium of clause 40, wherein the training of the machine learning model is an iterative process, each iteration comprises:

executing, using a perturbed target pattern of the set of perturbed patterns as the input, the machine learning model to generate a post-OPC pattern;

determining a difference between the model-generated post-OPC pattern and a reference pattern of the set of reference patterns associated with the perturbed target pattern; and modifying, based on the difference, a parameter of the machine learning model so that the difference is reduced or minimized.

43. The non-transitory computer readable medium of clause 42, wherein the machine learning model is a convolutional neural network (CNN), and the parameter is one or more weights of the CNN.

44. The non-transitory computer readable medium of any of clauses 40-43, wherein the match between the model-generated post-OPC pattern and the particular reference pattern is identical.

45. The non-transitory computer readable medium of any of clauses 40-44, wherein each reference pattern is a post-OPC pattern including a same assist feature.

46. The non-transitory computer readable medium of clause 45, wherein the obtaining of the training data set further comprises:

extracting at least one assist feature from the reference pattern; and generating, via executing the OPC process using the plurality of perturbed target patterns as the input and keeping the extracted assist feature fixed, the plurality of reference patterns, wherein each reference pattern of the plurality of reference patterns has the extracted assist feature.

The concepts disclosed herein may simulate or mathematically model any generic imaging system for imaging sub wavelength features, and may be especially useful with emerging imaging technologies capable of producing increasingly shorter wavelengths. Emerging technologies already in use include EUV (extreme ultra violet), DUV lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

The descriptions above are intended to be illustrative, not limiting. Thus, it will be apparent to one skilled in the art that modifications may be made as described without departing from the scope of the claims set out below.

The invention claimed is:

1. A non-transitory computer-readable medium comprising instructions therein, the instructions, when executed by one or more processors, configured to cause the one or more processors to at least:

obtain, via execution of a model using a target pattern to be printed on a substrate as an input to the model, a post optical proximity correction (post-OPC) pattern;

determine, based on the post-OPC pattern, a simulated pattern that will be printed on the substrate; and determine a mask pattern based on a difference between the simulated pattern and the target pattern by:

modification, based on the difference, of the target pattern inputted to the model such that the difference is reduced; and execution, using the modified target pattern, of the model to generate a modified post-OPC pattern from which the mask pattern can be derived.

2. The non-transitory computer readable medium of claim 1, wherein the model is a trained machine learning model configured to generate a post-OPC pattern for an input pattern.

3. The non-transitory computer readable medium of claim 2, wherein the instructions configured to cause the computer system to determine the mask pattern are further configured to cause the computer system to determine the mask pattern in an iterative manner, each iteration comprising:

modification, based on a gradient of the difference, of at least a portion of the target pattern inputted to the model to reduce the difference between the target pattern and the simulated pattern, the gradient being indicative of how the target pattern should be modified to reduce or minimize the difference;

execution, using the modified target pattern, of the trained machine learning model to generate the modified post-OPC pattern;

determination of the simulated pattern based on the modified post-OPC pattern;

determination of whether the difference between the simulated pattern and the target pattern is reduced or minimized; and responsive to the difference being reduced or minimized, extraction of polygon shapes from the modified post-OPC pattern to generate the mask pattern.

4. The non-transitory computer readable medium of claim 3, wherein the at least a portion of the target pattern inputted to the model comprises a contour corresponding to a target feature within the target pattern, and/or wherein the difference between the simulated pattern and the target pattern comprises a difference between a target contour of the target pattern and a simulated contour of the simulated pattern, and/or wherein the instructions configured to cause the computer system to modify the target pattern inputted to the model are further configured to cause the computer system to modify, based on the gradient of the difference, a contour of the target pattern to reduce the difference between a target contour of the target pattern and a simulated contour of the simulated pattern, the gradient being indicative of how a contour of the target pattern should be modified to reduce or minimize the difference.

5. The non-transitory computer readable medium of claim 3, wherein the instructions configured to cause the computer system to modify the target pattern inputted to the model are further configured to cause the computer system to:

assign control points on a target contour of the target pattern; and adjust, based on the gradient of the difference, a position of one or more control points such that the difference is reduced or minimized.

6. The non-transitory computer readable medium of claim 1, wherein the instructions configured to cause the computer system to determine the simulated pattern are further configured to cause the computer system to execute a process model of the patterning process using the post-OPC pattern or the modified post-OPC pattern to generate a simulated pattern.

7. The non-transitory computer readable medium of claim 1, wherein the instructions are further configured to cause the computer system to:

process, via thresholding, an image of the modified post-OPC pattern to detect edges associated with one or more features within the modified post-OPC pattern; and generate the mask pattern using the edges of the one or more features.

8. The non-transitory computer readable medium of claim 1, wherein the post-OPC pattern or the modified post-OPC pattern comprises: a main feature corresponding to the target feature, and at least one assist feature located around or beside the main feature.

9. The non-transitory computer readable medium of claim 8, wherein the model is a trained machine learning model and wherein the at least one assist feature is not modified in a second or a subsequent execution of the trained machine learning model when the modified target pattern is used.

10. The non-transitory computer readable medium of claim 1, wherein the target pattern, the post-OPC pattern, and/or the modified post-OPC pattern is a gray-scale pixelated image.

11. The non-transitory computer readable medium of claim 6, wherein the process model is an after development process model, and the simulated pattern is an after development image.

12. The non-transitory computer readable medium of claim 11, wherein the process model is a resist model and the simulated pattern is a resist pattern.

13. A method for determining a mask pattern to be employed in a patterning process, the method comprising:

obtaining, via executing, by a hardware computer system, a computer model using a target pattern to be printed on a substrate as an input to the model, a post optical proximity correction (post-OPC) pattern;

determining, based on the post-OPC pattern, a simulated pattern that will be printed on the substrate; and determining the mask pattern based on a difference between the simulated pattern and the target pattern, the determining of the mask pattern comprising:

modifying, based on the difference, the target pattern inputted to the model such that the difference is reduced; and executing, using the modified target pattern, the model to generate a modified post-OPC pattern from which the mask pattern can be derived.

14. The method of claim 13, wherein the model is a trained machine learning model configured to generate a post-OPC pattern for an input pattern.

15. The method of claim 14, wherein the determining of the mask pattern is done in an iterative manner, each iteration comprising:

modifying, based on a gradient of the difference, at least a portion of the target pattern inputted to the model to reduce the difference between the target pattern and the simulated pattern, the gradient being indicative of how the target pattern should be modified to reduce or minimize the difference;

executing, using the modified target pattern, the trained machine learning model to generate the modified post-OPC pattern;

determining the simulated pattern based on the modified post-OPC pattern;

determining whether the difference between the simulated pattern and the target pattern is reduced or minimized; and responsive to the difference being reduced or minimized, extracting polygon shapes from the modified post-OPC pattern to generate the mask pattern.

16. The method of claim 15, wherein the at least a portion of the target pattern inputted to the model comprises a contour corresponding to a target feature within the target pattern, and/or wherein the difference between the simulated pattern and the target pattern comprises a difference between a target contour of the target pattern and a simulated contour of the simulated pattern, and/or wherein the modifying the target pattern inputted to the model comprises modifying, based on the gradient of the difference, a contour of the target pattern to reduce the difference between a target contour of the target pattern and a simulated contour of the simulated pattern, the gradient being indicative of how a contour of the target pattern should be modified to reduce or minimize the difference.

17. The method of claim 15, wherein the modifying the target pattern inputted to the model comprises:

assigning control points on a target contour of the target pattern; and adjust, based on the gradient of the difference, a position of one or more control points such that the difference is reduced or minimized.

18. The method of claim 13, wherein the determining the simulated pattern comprises executing a process model of the patterning process using the post-OPC pattern or the modified post-OPC pattern to generate a simulated pattern.

19. The method of claim 13, further comprising:

processing, via thresholding, an image of the modified post-OPC pattern to detect edges associated with one or more features within the modified post-OPC pattern; and generating the mask pattern using the edges of the one or more features.

20. The method of claim 13, wherein the model is a trained machine learning model and wherein an assist feature is not modified in a second or a subsequent execution of the trained machine learning model when the modified target pattern is used.

* * * * *